United States Patent [19]
Eaton et al.

[11] Patent Number: 6,012,336
[45] Date of Patent: Jan. 11, 2000

[54] CAPACITANCE PRESSURE SENSOR

[75] Inventors: William P. Eaton, Tijeras; Bevan D. Staple; James H. Smith, both of Albuquerque, all of N. Mex.

[73] Assignee: Sandia Corporation, Albuquerque, N.Mex.

[21] Appl. No.: 09/206,693

[22] Filed: Dec. 7, 1998

Related U.S. Application Data

[63] Continuation-in-part of application No. 08/984,897, Dec. 4, 1997, which is a continuation of application No. 08/524,700, Sep. 6, 1995, Pat. No. 5,798,283.

[51] Int. Cl.$^7$ .............................. G01L 9/00; G01L 9/16
[52] U.S. Cl. ........................................................ 73/754
[58] Field of Search ........................... 73/720, 721, 718, 73/724, 726, 727; 437/228 IT, 228 SEN, 64, 71, 901, 921, 927, 20; 156/628.1, 657.1, 644.1; 216/33

[56] References Cited

U.S. PATENT DOCUMENTS

| | | | |
|---|---|---|---|
| 4,562,092 | 12/1985 | Wiech, Jr. | 427/58 |
| 4,859,629 | 8/1989 | Reardon | 437/203 |
| 5,095,401 | 3/1992 | Zayracky | 361/283 |
| 5,242,839 | 9/1993 | Oh | 437/5 |
| 5,260,596 | 11/1993 | Dunn | 257/414 |
| 5,314,572 | 5/1994 | Core | 156/643 |
| 5,326,726 | 7/1994 | Tsang | 437/228 |
| 5,345,824 | 9/1994 | Sherman | 73/517 B |
| 5,357,807 | 10/1994 | Guckel | 73/721 |
| 5,377,524 | 1/1995 | Wise | 73/4 R |
| 5,417,111 | 5/1995 | Sherman | 73/517 R |
| 5,427,975 | 6/1995 | Sparks | 437/79 |
| 5,431,057 | 7/1995 | Zimmer | 73/724 |
| 5,455,203 | 10/1995 | Koseki | 437/228 |
| 5,504,026 | 4/1996 | Kung | 437/51 |
| 5,550,090 | 8/1996 | Ristic | 437/228 |
| 5,631,428 | 5/1997 | Catanescu | 73/724 |
| 5,679,902 | 10/1997 | Ryhanen | 73/718 |
| 5,683,594 | 11/1997 | Hocker | 216/33 |
| 5,690,841 | 11/1997 | Elderstig | 216/39 |
| 5,736,430 | 4/1998 | Seefeeldt | 438/53 |
| 5,759,870 | 6/1998 | Yun | 437/228 |
| 5,783,340 | 7/1998 | Farino | 430/22 |

OTHER PUBLICATIONS

W. Kuehnel and S. Sherman, "A Surface Micromachined Silicon Accelerometer with On–Chip Detection Circuitry," *Sensors and Actuators A*, vol. 45, pp. 7–16, 1994.

W.P. Eaton and J.H. Smith, "A CMOS–Compatible, Surface–Micromachined Pressure for Aqueous Ultrasonic Application," *Proceedings of the Society of Photooptical Instrumentation Engineers* (SPIE), vol. 2448, pp. 258–265, Mar. 1995.

W.P. Eaton and J.H. Smith, "Characterization of a Surface Micromachined Pressure Sensor Array," *Proceedings of the Society of Photooptical Instrumentation Engineers* (SPIE), vol. 2642, pp. 256–264, Oct. 1995.

W.P. Eaton and J.H. Smith, "Planar Surface–Micromachined Pressure Sensor with a Sub–Surface, Embedded Reference Pressure Cavity," *Proceedings of the Society of Photooptical Instrumentation Engineers* (SPIE), vol. 2882, pp. 259–265, Oct. 1996.

W.P. Eaton IV, *Surface Micromachined Pressure Sensors*, Dissertation Thesis, University of New Mexico, Albuquerque, NM, May 1997.

*Primary Examiner*—William Oen
*Attorney, Agent, or Firm*—John P. Hohimer

[57] ABSTRACT

A microelectromechanical (MEM) capacitance pressure sensor integrated with electronic circuitry on a common substrate and a method for forming such a device are disclosed. The MEM capacitance pressure sensor includes a capacitance pressure sensor formed at least partially in a cavity etched below the surface of a silicon substrate and adjacent circuitry (CMOS, BiCMOS, or bipolar circuitry) formed on the substrate. By forming the capacitance pressure sensor in the cavity, the substrate can be planarized (e.g. by chemical-mechanical polishing) so that a standard set of integrated circuit processing steps can be used to form the electronic circuitry (e.g. using an aluminum or aluminum-alloy interconnect metallization).

70 Claims, 14 Drawing Sheets

CAPACITANCE PRESSURE SENSOR

CROSS REFERENCE TO RELATED APPLICATIONS

This is a continuation-in-part of co-pending application Ser. No. 08/984,897 filed on Dec. 4, 1997 which is a continuation of application Ser. No. 08/524,700 filed Sep. 6,1995 now U.S. Pat. No. 5,798,283 the disclosure of which is incorporated herein by reference.

GOVERNMENT RIGHTS

This invention was made with Government support under Contract No. DEAC04-94AL85000 awarded by the U.S. Department of Energy. The Government has certain rights in the invention.

FIELD OF THE INVENTION

The present invention relates generally to microelectromechanical (MEM) devices and methods for fabrication thereof, and in particular to a capacitance pressure sensor integrated with electronic circuitry on a common substrate.

BACKGROUND OF THE INVENTION

Microelectromechanical (MEM) devices have applications for forming many and varied types of microsensors and microactuators. The monolithic integration of MEM devices with electronic circuitry offers the possibility for increasing performance (e.g. forming "smart sensors" having driving, control, and signal processing circuitry formed therewith on a substrate or chip) and reliability as well as significantly reducing size and cost. Furthermore, the sensitivity of many types of microsensors (e.g. accelerometers) can be improved by a reduced noise level provided by on-chip circuitry.

U.S. Pat. No. 5,326,726 to Tsang et al discloses an interleaved or merged process approach for fabricating a monolithic chip containing integrated circuitry interconnected to a microstructure (i.e. a MEM device). The approach of Tsang et al requires that the separate steps for forming the MEM device and the integrated circuit be interleaved for compatibility, with the electronic circuitry being formed at least in part prior to the MEM device, and electrical interconnections between the circuitry and the MEM device being formed thereafter. While Tsang et al use some essentially standard process steps, other process steps must be modified due to conflicting requirements between the circuitry and MEM devices.

These modified process steps are primarily dictated by thermal cycles and topography during processing which are largely responsible for determining a strategy for developing a merged or interleaved approach for integrating MEM devices with electronic circuitry. As an example, "islands" of severe topography can be formed by MEM devices extending upward several microns above the substrate, requiring modifications to photolithography and etching processes for forming electrical interconnections between the MEM devices and circuitry. Such modification of process steps to the extent that it deviates from standard processing steps is disadvantageous and costly in requiring that the modified process steps be adapted to a particular type of MEM device, and altered for fabrication of other types of MEM devices. The development of non-standard process steps for forming electronic circuitry that are dictated by requirements of a particular MEM device is disadvantageous in requiring a lengthy period of time for process modification or re-engineering, thereby preventing rapid prototyping of different MEM technologies or MEM development work. Furthermore, since process steps for forming electronic circuitry (e.g. CMOS) are well established and standardized, any modification of the process steps can significantly decrease the circuit performance and the overall process yield.

What is needed is a method for integrating MEM devices with electronic circuitry that substantially separates the process steps for fabricating the MEM devices from the process steps for fabricating the electronic circuitry, thereby allowing the use of standard process steps as known to the art, especially for fabricating the electronic circuitry.

Heretofore, such a separation of steps for fabricating MEM devices and steps for fabricating electronic circuitry has been based on fabricating the electronic circuitry prior to fabricating the MEM devices in a circuitry-first approach. This approach has been primarily motivated by concerns about contamination and a rough topography that is generally thought to be inevitable if the MEM devices were to be fabricated first. A rough topography places severe demands on subsequent lithography and etching processes for forming the electronic circuitry. The use of a circuitry-first approach, however, is disadvantageous in requiring deviations from standard processing steps (i.e. process modifications), especially in requiring the use of tungsten instead of aluminum for the interconnect metallization to withstand a high-temperature annealing step required to at least partially relieve stress in polysilicon elements (e.g. cantilevered beams) of MEM devices. However, the use of tungsten as an interconnect metallization is not altogether satisfactory, resulting in additional problems including a high contact resistance and hillock formation that can lead to failure of a nitride layer protecting the circuitry during release of the MEM devices. Additional problems known to occur with this prior-art circuitry-first approach include an undesirable formation of tungsten silicides, and poor adhesion of the tungsten interconnect metallization.

An advantage of the present invention is that microelectromechanical (MEM) devices including capacitance pressure sensors can be integrated with electronic circuitry on a common substrate while using standard process steps with little if any modification for fabricating the electronic circuitry, including the use of an aluminum interconnect metallization in preferred embodiments of the present invention.

Another advantage of the present invention is that one or more MEM devices (e.g. capacitance pressure sensors) can be fabricated, at least in part, prior to the fabrication of associated electronic circuitry, with the MEM devices being encapsulated to prevent contamination of a device surface (i.e. an upper surface) of the substrate.

A further advantage of the present invention is that the substrate can be planarized (e.g. by chemical-mechanical polishing) prior to formation of the electronic circuitry thereby providing a substantially smooth and planar surface topography for subsequent process steps for fabricating the electronic circuitry.

Still another advantage of the present invention is that the encapsulated MEM devices can be annealed under temperature and time conditions sufficient to relieve strain in elements of the MEM devices (e.g. in a polysilicon pressure-sensing diaphragm) prior to formation of the electronic circuitry including the interconnect metallization.

Yet another advantage of the present invention is that by providing one or more encapsulated MEM devices formed within a cavity below a device surface of a planarized substrate, the substrate can be handled and processed thereafter using substantially standard process steps with little if any modification for forming the electronic circuitry (including the interconnect metallization).

Another advantage of the present invention is that a capacitance pressure sensor can provide an increased sensitivity as compared with a piezoresistive pressure sensor.

These and other advantages of the apparatus and method of the present invention will become evident to those skilled in the art.

SUMMARY OF THE INVENTION

The present invention relates to a microelectromechanical (MEM) capacitance pressure sensor comprising a capacitance pressure sensor integrated with electronic circuitry on a single substrate and a method for forming such a device.

According to a first embodiment of the present invention, the MEM capacitance pressure sensor comprises a silicon substrate having an upper surface; a cavity formed below the upper surface of the silicon substrate; a first capacitor plate formed in the substrate below the cavity with a dopant type opposite that of the substrate, and forming in combination with the substrate a reverse-biased semiconductor p-n junction; a substantially planar diaphragm covering the cavity; a second capacitor plate formed on a surface of the diaphragm; and electronic circuitry, comprising a plurality of transistors, formed on the substrate proximate to the cavity and connected to the first and second capacitor plates for sensing a change in pressure from a deflection in the diaphragm.

A method for forming a MEM capacitance pressure sensor according to the first embodiment of the present invention comprises steps for providing a doped silicon substrate; forming a cavity below an upper surface of the substrate; forming a first capacitor plate in a portion of the substrate below the cavity by doping the portion of the substrate with a dopant type opposite from the dopant type of the substrate; depositing a sacrificial material within the cavity and overfilling the cavity; planarizing the substrate; forming a diaphragm covering the cavity; forming a second capacitor plate on a surface of the diaphragm; fabricating electronic circuitry comprising a plurality of transistors on the upper surface of the substrate, with the electronic circuitry being electrically connected to the first and second capacitor plates; and removing the sacrificial material, at least in part, from within the cavity. A further step is preferably provided for annealing the substrate prior to fabricating the electronic circuitry to relieve any stress within the diaphragm.

In the first embodiment of the present invention, the step for forming the capacitor plate by doping the first portion of the substrate can comprise a thermal diffusion step or an ion implantation step. The thermal diffusion step can be carried out after depositing the sacrificial material, in which case the sacrificial material preferably comprises a first-deposited layer of a doped silicate glass such as borosilicate glass (BSG) for p-type doping the first portion of an n-type-doped silicon substrate, or phosphosilicate glass (PSG) for n-type doping the first portion of a p-type-doped silicon substrate. The sacrificial material can further comprise one or more layers of an undoped silicate glass or silicon dioxide deposited to overfill the cavity. The ion implantation step can directly implant p-type ions (e.g. boron ions) in an n-type-doped silicon substrate or n-type ions (e.g. phosphorous ions) in a p-type-doped silicon substrate, in which case the borosilicate or phosphosilicate glass can be omitted and the cavity can subsequently be overfilled with one or more layers of silicate glass or silicon dioxide.

According to a second embodiment of the present invention, the MEM capacitance pressure sensor can comprise a silicon substrate having a cavity formed below an upper surface thereof; a capacitance pressure sensor formed within the cavity below the upper surface of the substrate and further comprising a lower capacitor plate and an upper capacitor plate spaced apart from each other, with one of the capacitor plates being moveable in response to applied pressure; and electronic circuitry, comprising a plurality of transistors, formed on the upper surface of the substrate proximate to the cavity and connected to the capacitor plates for sensing the applied pressure.

The method for forming the MEM capacitance pressure sensor on a silicon substrate according to the second embodiment of the present invention comprises steps for forming a cavity below an upper surface of the substrate; forming a first capacitor plate by depositing a layer of an electrically conductive material within the cavity; forming a second capacitor plate above the first capacitor plate; depositing a sacrificial material within the cavity and overfilling the cavity; planarizing the substrate; fabricating electronic circuitry comprising a plurality of transistors on the upper surface of the substrate, with the electronic circuitry being electrically connected to the first and second capacitor plates; and removing the sacrificial material, at least in part, from within the cavity. The second embodiment of the present invention can further include a step for annealing the substrate for relieving any stress within the deposited layers prior to the step for fabricating the electronic circuitry.

The cavity in each embodiment of the present invention is preferably formed by etching using either dry etching with a plasma (e.g. reactive ion etching) or wet etching with an anisotropic etchant comprising potassium hydroxide (KOH), tetramethyl ammonium hydroxide (TMAH) or ethylenediamine pyrocatechol (EDP). The step for planarizing the substrate in each embodiment of the present invention preferably comprises chemical-mechanical polishing (CMP).

The step for fabricating electronic circuitry in each embodiment of the present invention preferably comprises fabricating the electronic circuitry with an aluminum or aluminum-alloy interconnect metallization. Additionally, the electronic circuitry can be complementary metal-oxide (CMOS) circuitry, or bipolar complementary metal-oxide (BiCMOS) circuitry, or bipolar circuitry.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
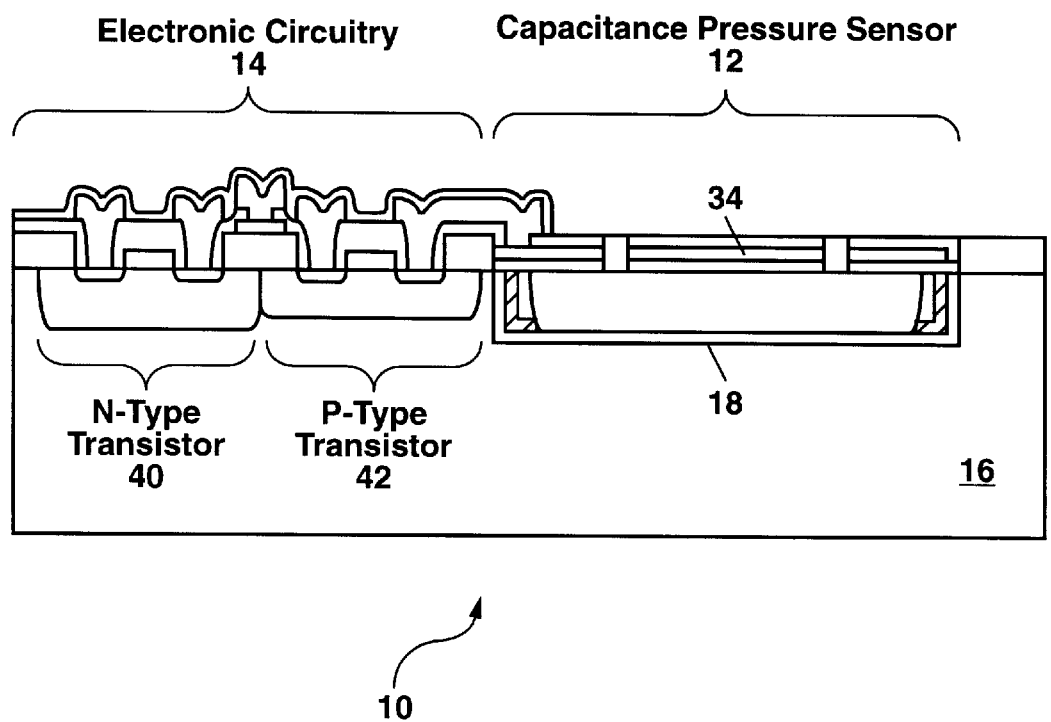
FIG. 1 schematically illustrates a cross-sectional representation of a MEM capacitance pressure sensor according to a first embodiment of the present invention.

The present invention is based on combining processes for fabricating microelectromechanical (MEM) devices with processes for fabricating electronic circuitry (e.g. CMOS, BiCMOS, bipolar or the like) in a mutually compatible manner to form an integrated MEM capacitance pressure sensor 10. The MEM capacitance pressure sensor 10 according to a first embodiment of the present invention comprises a capacitance pressure sensor 12 integrated with electronic activation and readout circuitry 14 on a common substrate or chip 16 as shown in FIG. 1. Such integration provides advantages in terms of increased functionality and sensitivity, and reduced size and cost as compared to a pressure sensor being formed on a separate chip from the electronic circuitry.

The first embodiment of the integrated MEM capacitance pressure sensor 10 can be formed as described hereinafter with reference to FIGS. 2a–2l.

Figure 2A:
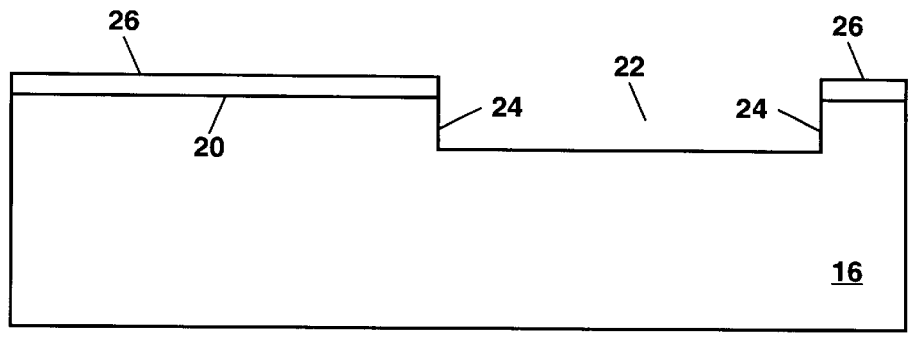
FIGS. 2a–2l show schematic cross-section representations of the MEM capacitance pressure sensor of FIG. 1 during various process steps for forming the device.

In FIG. 2a, a substrate 16 is provided for formation of the integrated MEM capacitance pressure sensor 10. The substrate 16 represents a portion of a monocrystalline silicon wafer which is made sufficiently thick so as to permit handling, while the lateral dimensions of the wafer are generally large enough such that the wafer can be subsequently diced into a number of chips each containing at least one integrated device 10. The term "substrate" as used herein is defined to include both a monocrystalline silicon wafer and a monocrystalline silicon wafer having one or more layers of silicon epitaxially grown thereupon. Thus, the substrate 16 can include one or more epitaxial semiconductor layers formed thereon (including doped and undoped layers) with a total layer thickness of about 2–10 $\mu$m or more for providing a smooth low-defect-density upper surface 20 (also termed a device surface) suited for formation of the electronic circuitry 14. In some embodiments of the present invention, the substrate 16 can include a buried doped epitaxial layer (e.g. for forming BiCMOS or bipolar circuitry).

The substrate can be undoped or n- or p-type doped depending on a predetermined set of standard processes (and including design rules) to be used for forming the electronic circuitry 16. For the first embodiment of the present invention, the substrate is preferably either n-type doped or p-type doped to form a reverse-biased semiconductor p-n junction in combination with a lower capacitor plate 18 as shown in FIG. 1. As an example, an n-type substrate 16 can be used for forming electronic circuitry 14 by one set of standard CMOS process steps having 2-$\mu$m design rules; whereas for electronic circuitry 14 formed by another set of standard CMOS processing steps having 0.5-$\mu$m design rules, a p-type substrate is preferred.

In FIG. 2a, one or more open cavities 22 are etched into the upper surface 20 of the substrate 16 at predetermined locations wherein one or more MEM pressure sensors 12 are to be fabricated. The dimensions of cavity 22 including its length, width and depth, will in general depend the geometric configuration of a particular type of MEM pressure sensor 12 to be formed (e.g. circular or square shaped), and on a range of pressure to be sensed. As an example, circular-shaped pressure sensors 12 formed according to the present invention can have a diameter in the range of 50–500 $\mu$m, with a depth of the cavity 22 ranging from 2–25 $\mu$m. Square-shaped pressure sensors 12 can be dimensioned similarly.

The cavity 22 in FIG. 2a can be formed by a wet or dry etching process. To form the MEM pressure sensor 12 in the first embodiment of the present invention with sidewalls 24 that are substantially vertical (i.e. orthogonal to the upper surface 20 of the substrate 16), an anisotropic dry etching process (i.e. plasma etching) can be used. To anisotropically dry etch the cavity 22, a mask layer 26 (e.g. 500 nanometers of a silicate glass deposited from the decomposition of tetraethylortho silicate, also termed TEOS, that has been densified by heating to a high temperature) can be formed over the upper surface 20 and patterned to provide openings at the locations of each cavity 22 to be formed. The term "patterned" as used herein means a series of process steps including applying a photoresist to a surface of the substrate 16 or a layer thereon, pre-baking the photoresist, aligning the layer covered with photoresist with a photomask (also termed a reticle), exposing and developing the photoresist to remove the photoresist at locations where particular features (e.g. one or more cavities 22) are to be formed, etching downward into or through a portion of the layer not protected by the photoresist, and removing the remaining photoresist so that further processing can take place. After formation and patterning of the mask layer 26, the substrate 16 can be plasma etched to a predetermined depth to form the cavity 22. The mask layer 26 can then be removed (e.g. with a 6:1 buffered oxide etchant comprising HF).

Figure 3:
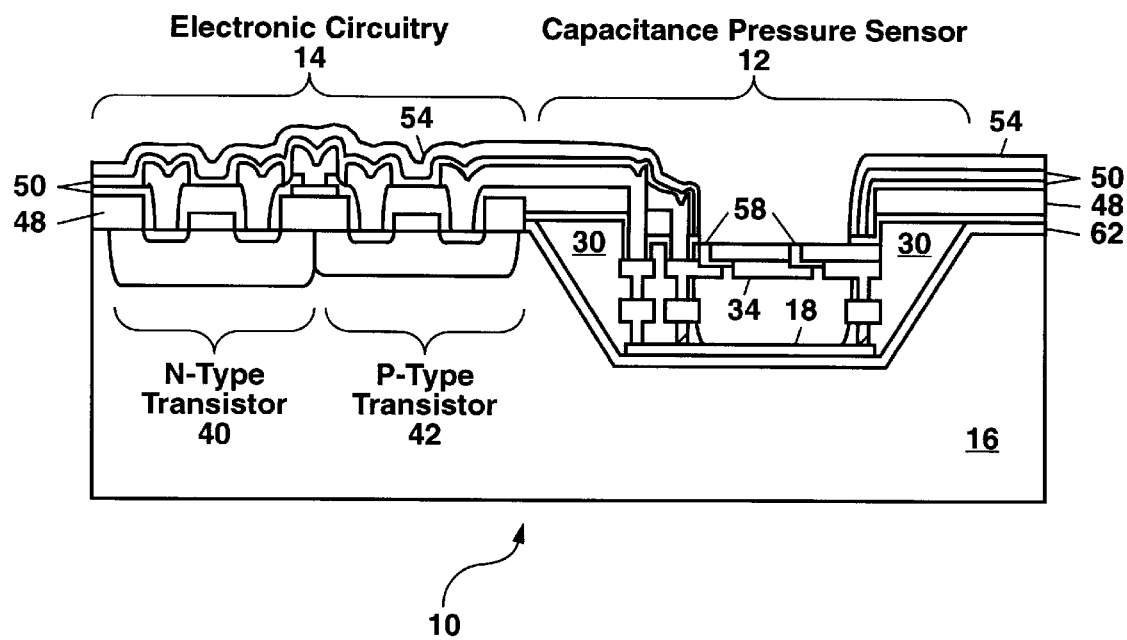
FIG. 3 schematically illustrates a cross-sectional representation of a MEM capacitance pressure sensor according to a second embodiment of the present invention.

In other embodiments of the present invention, a bulk micromachining process can be used to form one or more cavities 22 having sloping sidewalls 24. This can be done by providing a patterned mask layer 26 as previously described and using an anisotropic wet etchant such as potassium hydroxide (KOH), tetramethyl ammonium hydroxide (TMAH) or ethylenediamine pyrocatechol (EDP) that terminates etching upon reaching silicon (111) crystalline planes. If the depth of the cavity 22 is much less than a lateral dimension of the cavity, then the cavity 22 will be formed with a substantially planar bottom surface and sloping sidewalls (see FIG. 3). The use of an anisotropic etchant can be advantageous for providing improved optical access to the bottom surface of the cavity thereby providing an increased latitude for subsequent photolithography steps for forming elements of the MEM device 10 within the cavity 22 (e.g. for forming support posts 66 for supporting the upper capacitor plate 34 above the lower capacitor plate 18 and for forming an electrical interconnection 68 to the lower capacitor plate 18 as shown in FIGS. 3 and 4j).

Figure 2B:
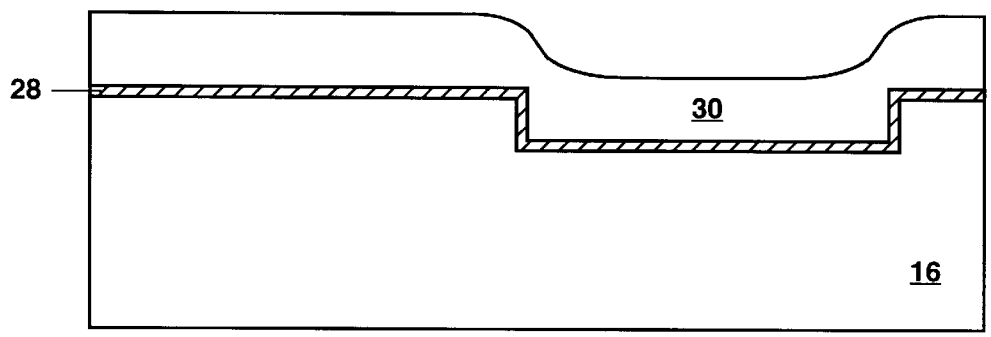

In FIG. 2b, a layer of doped silicate glass 28 is blanket deposited over the substrate 16 and in the cavity 22. If the substrate 16 is p-type doped, then the doped silicate glass 28 preferably comprises an n-type dopant (e.g. phosphorous) that can be used to convert a portion of the substrate 22 to n-type silicon after a thermal diffusion step. An example of the doped silicate glass 28 containing an n-type dopant is phosphosilicate glass, also termed PSG which contains phosphorous. Similarly, if the substrate 16 is n-type doped, then the doped silicate glass 28 preferably comprises a p-type dopant (e.g. boron) that can be used to convert a portion of the substrate 22 to p-type silicon after the thermal diffusion step. An example of the doped silicate glass 28 containing a p-type dopant is borosilicate glass, also termed BSG which contains boron. In these examples, the phosphosilicate or borosilicate glass can be blanket deposited by chemical vapor deposition (CVD). The phosphosilicate or borosilicate glass can form a part of a sacrificial material which fills the cavity 22 and is later removed by a selective etchant during an etch release step.

In FIG. 2b, one or more additional layers of a sacrificial material 30 (also termed sacrificial layers) are blanket deposited over the substrate 16 to overfill the cavity 22 (i.e. to completely fill the cavity 22 and extend outward therefrom). These sacrificial layers 30 can be grown or deposited in a completely conventional manner (e.g. by CVD wherein a silicon dioxide or silicate glass layer-forming gas is decomposed to form the layers 30; or by plasma-enhanced CVD, also termed PECVD, wherein applied radio-frequency power is provided to assist the decomposition of source gases for deposition at a low temperature of about 600° C. or less). In a preferred embodiment of the present invention, the sacrificial material 30 comprises TEOS deposited by CVD from the decomposition of tetraethylortho silicate.

Figure 2C:
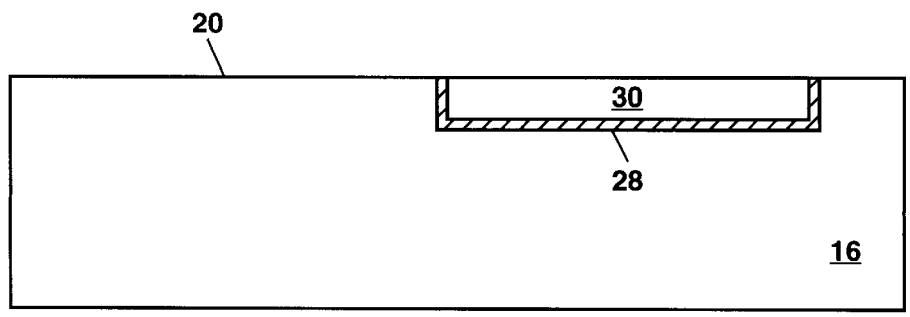

In FIG. 2c, the substrate 16 is planarized to remove the doped silicate glass 28 and the sacrificial material 30 that extends upward beyond the cavity 22. This can be done using a chemical-mechanical polishing (CMP) process step as known to the art. In the CMP step, the substrate 16 is polished by contact with a rotating polishing pad and slurry (e.g. an alkaline colloidal-fumed silica slurry) under controlled conditions of rotation speed, applied pressure and temperature. The CMP step proceeds until the sacrificial material 30 and doped silicate glass 28 is removed down to or slightly below the upper surface 20 of the substrate outside the cavity 22, thereby globally planarizing the substrate 16. A patterning step can also be used to remove the doped silicate glass 28 and the sacrificial material 30 in regions of the substrate 16 away from the cavity 22. Then a CMP step can more quickly remove the doped silicate glass 28 and the sacrificial material 30 directly over the cavity 22.

Figure 2D:
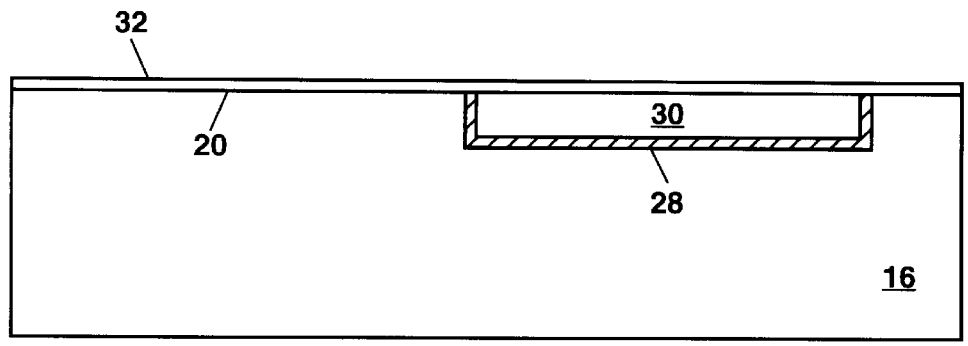

In FIG. 2d, an insulating dielectric layer 32 comprising, for example, about 100–200 nanometers of silicon nitride, formed by a low-pressure chemical vapor deposition (LPCVD) process that produces low residual stress in the nitride layer, can be deposited to blanket the upper surface 20 of the substrate 16 and to form a diaphragm adhered to the upper surface 20 of the substrate 16 around the periphery of the cavity 22 for covering and sealing the filled cavity.

Figure 2E:
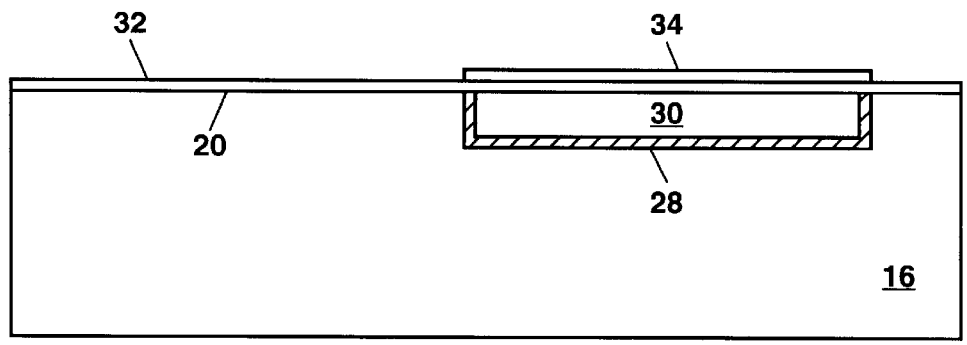

In FIG. 2e an upper capacitor plate 34 can be formed by depositing and patterning an electrically conductive layer which preferably comprises doped polysilicon (i.e. polycrystalline silicon) above a portion of the layer 32. A layer thickness of the upper capacitor plate 34 will, in general, depend on the size of the MEM pressure sensor 12, on whether the space between the capacitor plates 18 and 34 will be evacuated and on a particular range of pressure to be sensed (e.g. low pressures from vacuum to atmospheric pressure, or high pressures from atmospheric pressure to hundreds or thousands of pounds-per-square inch). The thickness of the upper capacitor plate 34 can be, for example, in the range of 0.2–2 μm. Additional layers of material can be deposited over the upper capacitor plate 34 to protect and/or stiffen the plate 34.

In other embodiments of the present invention, the electrically conductive layer used to form the upper capacitor plate 34 can be a layer of a metal or a metal alloy that is located on a topside or an underside of the diaphragm (i.e. deposited after or before deposition of the layer 32). The upper capacitor plate 34 can be formed below the diaphragm, for example, by etching downward into the sacrificial material 30 after the planarization step in FIG. 2c to form a recess into which an electrically conductive material (e.g. doped polysilicon) can be deposited. Any of the electrically conductive material left on the upper surface 20 or extending above the recess can be removed by chemical mechanical polishing, or alternately by a patterning step. After formation of the upper capacitor plate 34, the insulating dielectric layer 32 (e.g. silicon nitride) can be blanket deposited over the substrate 16 to form the diaphragm above the upper capacitor plate 34.

In yet other embodiments of the present invention, the upper capacitor plate 34 can be formed integrally with the diaphragm, for example, by blanket depositing the insulating dielectric layer 32 (e.g. silicon nitride) on the upper surface 20 and removing a portion of the layer 32 overlying the sacrificial material 30. Polysilicon can then be deposited over the insulating dielectric layer 32 and over the sacrificial material 30 to form the diaphragm. A portion of this polysilicon layer can be doped (e.g. with boron or phosphorous) by ion implantation or thermal diffusion to form the upper capacitor plate 34.

Figure 2F:
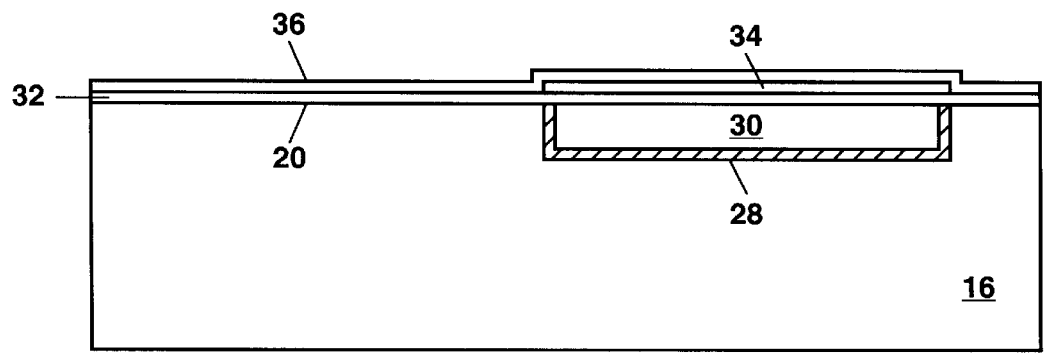

In FIG. 2f, a cap layer 36 comprising typically 100–300 nanometers of LPCVD silicon nitride can be blanket deposited over the substrate 16 and upper capacitor plate 34 in preparation for a thermal annealing step. The thermal annealing step, performed at a high temperature in the range of 700–1300° C. for a time period of up to several hours, serves to remove any stress in the polysilicon layer forming the upper capacitor plate 34, and also to thermally diffuse dopant ions from the doped silicate glass 28 into an adjacent portion of the substrate 16 which contacts the doped silicate glass 28, thereby converting that portion of the substrate to the opposite dopant type. Alternately, the annealing step can be performed during a thermal cycle used for fabricating the electronic circuitry 14 (e.g during one or more thermal diffusion steps used for forming a plurality of transistors).

The diffused dopant ions convert the adjacent portion of the substrate 16 to a dopant type (i.e. n-type or p-type) opposite the dopant type of the remainder of the substrate 16, thereby forming the lower capacitor plate 18 of the MEM pressure sensor 10. Since the lower capacitor plate 18 is doped oppositely from the substrate 18 and forms, in combination with the substrate, a reverse-biased semiconductor p-n junction, the lower capacitor plate 18 is effectively electrically isolated from the substrate 16.

Figure 2G:
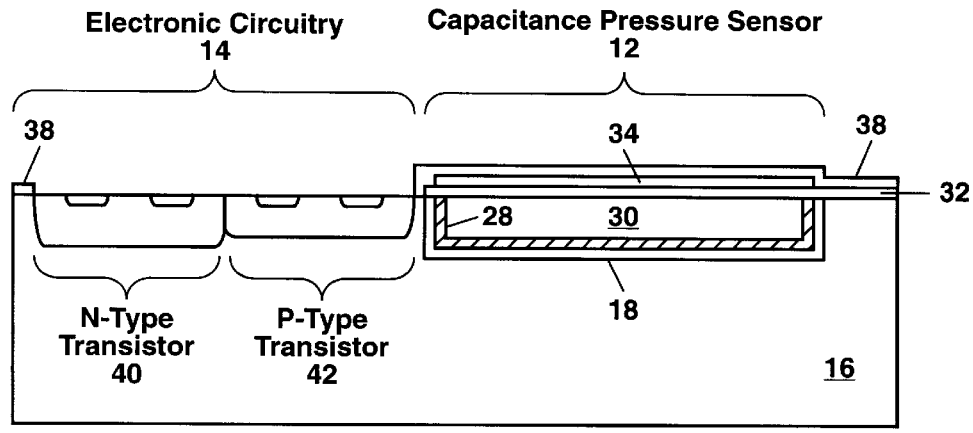

In FIG. 2g, electronic circuitry 14 can be formed on a portion of the substrate 16 proximate to the lower capacitor plate 18 of the MEMS capacitance pressure sensor 12 being formed using a set of standard process steps as known to the art of semiconductor integrated circuits (ICs). The electronic circuitry 14 comprises a plurality of interconnected transistors and circuit elements (e.g. resistors and capacitors) formed on or above the upper surface 20 of the substrate 16 according to a predetermined circuit diagram for activating and reading out the capacitance pressure sensor 12 and using a predetermined set of design rules (e.g. 0.5 or 2 μm design rules to form transistors having a corresponding feature size). The process for forming the electronic circuitry 14 will be described hereinafter with reference to a preferred process for forming complementary metal-oxide semiconductor (CMOS) circuitry. However, it will be understood by those skilled in the art that the electronic circuitry 14 can also be formed as bipolar complementary metal-oxide semiconductor (BiCMOS) circuitry or bipolar circuitry using a set of conventional process steps well-known in the art. Additionally, the formation of integrated electronic circuitry (e.g. CMOS, BiCMOS or bipolar electronic circuitry) can comprise up hundreds of individual steps which are well-known in the art and which have been standardized in the integrated circuit (IC) industry. Therefore, for clarity, only a few steps that are relevant to the present invention are discussed herein; and these process steps will be discussed with reference to the formation of a MEM capacitance pressure sensor 10 comprising CMOS electronic circuitry 14.

To begin formation of the electronic circuitry 14, the cap layer 36 can be completely removed, and the dielectric layer 32 can be locally removed to expose the upper surface 20 in a portion of the substrate 16 reserved for the electronic circuitry 14. A thermal oxide layer comprising about 30–40 nanometers of silicon dioxide can then be formed by a thermal diffusion process whereby silicon at the upper surface 20 is converted into silicon dioxide. A silicon nitride layer 38 of about 120 nanometers thickness can then be blanket deposited over the substrate 16 by plasma-enhanced chemical vapor deposition (PECVD), and patterned to form openings down to the upper surface 20 at the locations of a plurality of n-type transistors 40 and p-type transistors 42 to be formed in the substrate 16. The transistors 40 and 42 can be formed by a set of standard CMOS process steps whereby n-type and p-type isolation wells (also termed tubs) are formed below the upper surface 20 by ion implantation and thermal diffusion steps. Subsequently, as shown in FIG. 2g, n-type source and drain regions are formed within the p-type wells at the locations of n-type transistors 40; and p-type source and drain regions are formed within the n-type wells at the locations of p-type transistors 42.

Figure 2H:
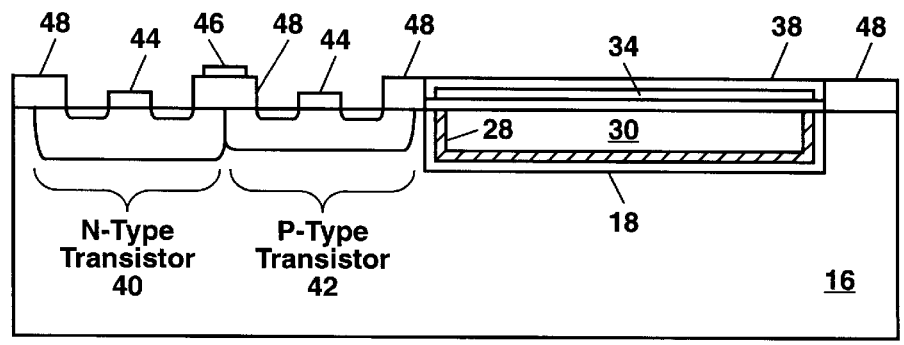

In FIG. 2h, the standard CMOS process steps can further include the deposition and patterning of one or more poly-silicon layers for forming transistor gates 44 and resistors 46. In some embodiments of the present invention, formation of a polysilicon diaphragm and/or an upper capacitor plate 34 can be delayed until formation of the electronic circuitry 14 so that the steps for depositing and patterning the polysilicon layer(s) to form the transistor gates 44 can also be used to form the diaphragm and/or the upper capacitor plate 34. Steps can also be provided to deposit and pattern a field oxide layer 48 (e.g. CVD silicon dioxide) over the substrate 16.

Figure 2I:
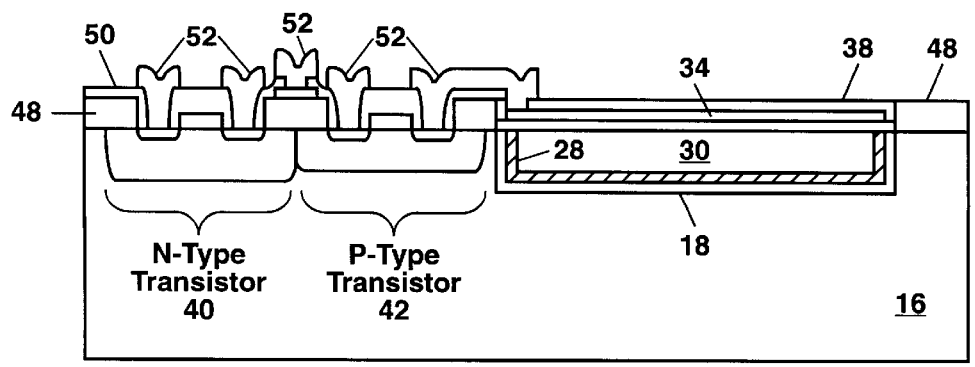

In FIG. 2i, one or more passivation layers 50 comprising a silicate glass such as TEOS; plasma-enhanced TEOS (also termed PETEOS); PSG; borophosphorous silicate glass (also termed BPSG) or combinations thereof can be deposited over the substrate, for example, by CVD or PECVD and patterned to provide openings for the deposition of a patterned metallization 52 to interconnect the transistors and circuit elements (e.g. resistors 46) and to provide an electrical interconnection to the lower and upper capacitor plates, 18 and 34 respectively, of the capacitance pressure sensor 12.

The interconnect metallization 52, which preferably comprises a standard aluminum or aluminum alloy metallization as used in the IC art, can be formed by conventional deposition and patterning steps. Multiple layers of interconnect metallization 52 can be separated by additional passivation layers 50 (e.g. about 200 nanometers of a silicate glass such as PETEOS). The interconnect metallization 52 can further be overcoated with another passivation layer 50 for protection and stress relief as shown in FIG. 2j.

The interconnect metallization 52, which is considered herein to form a part of the electronic circuitry 14, is used to interconnect various circuit elements (e.g. transistors, resistors, capacitors) forming the electronic circuitry 14, to connect the electronic circuitry 14 to the MEM pressure sensor 12 (e.g. by patterning and etching down through the silicon nitride layer 38 and any overlying layers to expose the upper capacitor plate 34 prior to deposition or sputtering of the interconnect metallization 52), and to form a plurality of bonding or contact pads (not shown) for packaging the integrated MEM capacitance pressure sensor 10. Although, aluminum or an alloy thereof is preferred for use as the interconnect metallization 52, other metals (e.g tungsten, gold, copper, platinum, nickel, palladium), metal alloys (including metal suicides) and even doped polysilicon can be used for the electrical interconnections depending upon operating requirements for the integrated device 10, and also depending upon a particular set of standard process steps to be used for forming the electronic circuitry 14.

Figure 2J:
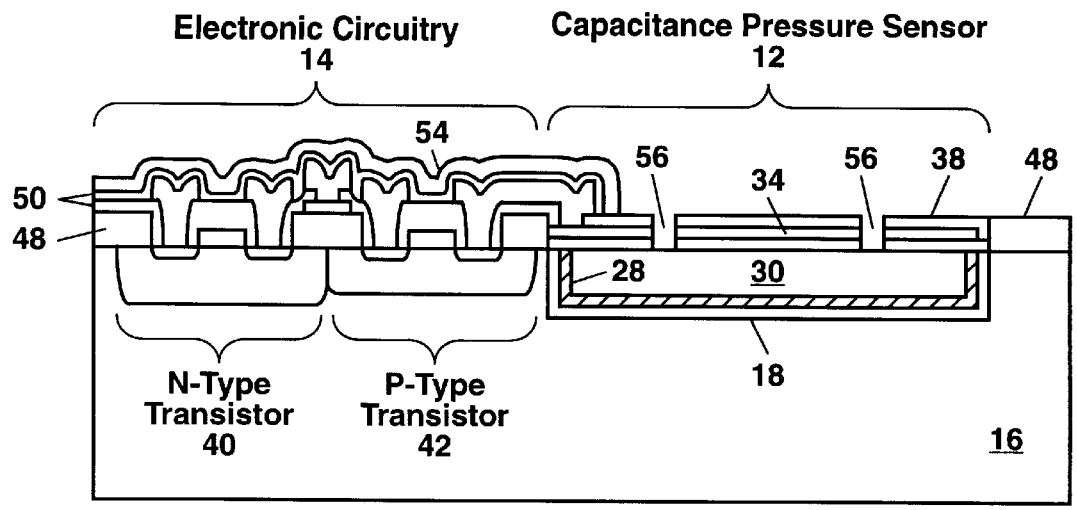

In FIG. 2j, a protection layer 54 can also be deposited to cover the electronic circuitry and interconnect metallization for use during an etch release step whereby the layers of doped silicate glass 28 and sacrificial material 30 are removed, at least in part, by a selective etchant comprising hydrofluoric acid (HF). The protection layer 54 can comprise any material that is substantially chemically resistant to attack by HF, including photoresist, polyimide, silicon nitride (e.g. deposited by PECVD), or tungsten. A photoresist, polyimide or silicon nitride protection layer 54 can be used when the selective etchant comprises a buffered oxide etchant; whereas a protection layer 54 comprising tungsten is preferred when the selective etchant comprises a more aggressive etchant such as a mixture of HF and hydrochloric acid (HCI) or a mixture of HF and water ($H_2O$). The selective etchant can also comprise HF in a vapor form. The exact proportions of the constituents in each mixture can be adjusted to provide a predetermined etching rate for selectively removing the layers of doped silicate glass 28 and sacrificial material 30 while not substantially affecting the silicon substrate 16 or the protected electronic circuitry 14.

A tungsten protection layer 54 can be formed after initially depositing a thin passivation layer 50 (e.g. about 200 nanometers of a silicate glass such as PETEOS) to cover the electronic circuitry 14. The tungsten protection layer 54 preferably includes an adhesion layer comprising about 50 nanometers of titanium nitride (TiN) deposited by sputtering or CVD over the electronic circuitry 14. A thicker layer (e.g. about 0.1–1 microns thick) of tungsten (W) is then deposited over the titanium nitride layer (e.g. by CVD using $WF_6$ as a source gas). This forms a two-ply protection layer 54 which has a substantial chemical resistance to the HF:HCL or HF:$H_2O$ selective etchants to prevent any damage to the electronic circuitry 14 during removal of the layers of doped silicate glass 28 and sacrificial material 30. After removal, at least in part, of the layers of doped silicate glass 28 and sacrificial material 30, the tungsten-based protection layer 54 can be removed using another selective etchant comprising hydrogen peroxide.

After formation of the protection layer 54 in FIG. 2j, the protection layer can be overcoated with a thin layer (about 100 nanometers) of PECVD silicon dioxide or silicate glass (e.g. TEOS) to improve adhesion for a subsequently-formed photoresist layer (not shown). This photoresist layer is photolithographically patterned and used to dry a plurality of openings or channels 56 down through all the layers overlying the sacrificial material 30, thereby exposing the sacrificial material 30 for etching by the selective etchant comprising HF. The channels 56 are typically micron sized so that they can be later sealed.

Figure 2K:
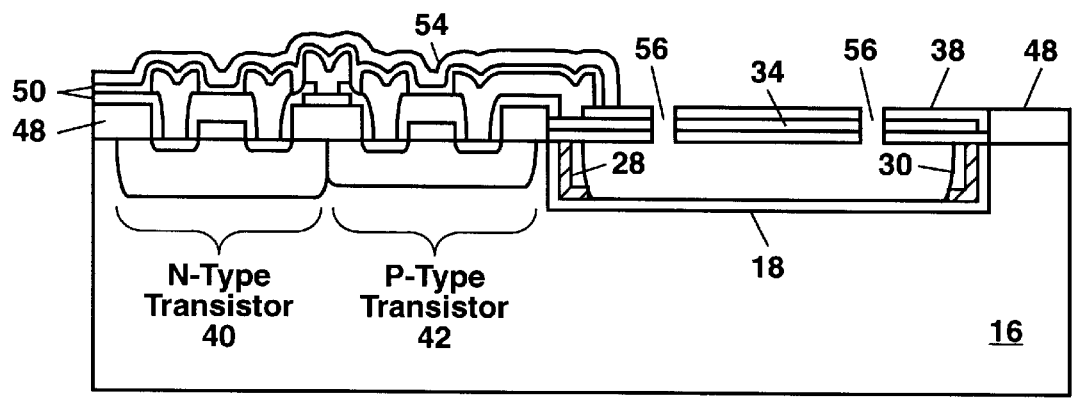
Figure 2L:
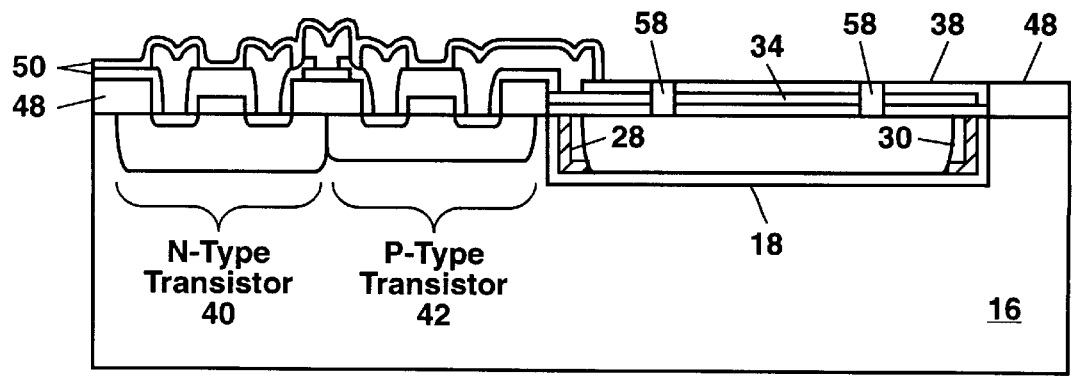

In FIG. 2k, the layers of doped silicate glass 28 and sacrificial material 30 are removed, at least in part, by selective etching with the selective etchant comprising HF. The selective etching step (also termed an etch release step) can be timed to remove a predetermined amount of the doped silicate glass 28 and sacrificial material 30 as shown in FIG. 2k, or can proceed for a long time duration of up to several hours or more to remove substantially all of the doped silicate glass 28 and sacrificial material 30.

After the etch release step, the substrate 16 can be washed and dried and the protection layer 54 can be removed. The silicon nitride layer 38 overlying the upper capacitor plate 34 can also be removed, although this is optional and will generally depend on an overall thickness of the layers 32, 34 and 38 and a pressure range for use of the integrated device 10.

To form a sealed-cavity device 10, the channels 56 can be plugged by deposition of a material (e.g. PECVD silicon nitride, or sputtered or evaporated metal) to form plugs 58 in each channel 56 thereby sealing the cavity formed by removal of the doped silicate glass 28 and sacrificial material 30. This step, shown schematically in FIG. 2l, can be performed in a deposition chamber to provide a predetermined level of vacuum or pressure within the cavity between the capacitor plates 18 and 34. The completed device 10 can then be packaged by any means known to the art including the use of relatively inexpensive molded packages formed of plastics, epoxy or the like.

Variations of the first embodiment of the present invention are possible. For example, the layer of doped silicate glass 28 can be omitted, and the lower capacitor plate 18 can be formed by thermally diffusing dopant ions of a polarity opposite that of the substrate 18 into the substrate 18 at the bottom and sidewalls of the cavity 22. Alternately, if the cavity 22 is formed with sloped sidewalls, ion implantation can be used to implant dopant ions of a polarity opposite that of the substrate into the substrate at the bottom and sidewalls of the cavity 22. The cavity 22 can then be overfilled solely with one or more layers of sacrificial material 30.

Still other variations of the present invention are possible. The etch release step is preferably performed after formation of the electronic circuitry 14. However, there is no reason why the etch release step cannot be performed and the cavity plugged and sealed prior to formation of the electronic circuitry 14. This would eliminate the need for protection layer 54.

FIG. 3 shows a second embodiment of the present invention wherein the lower capacitor plate 18 is formed by depositing a layer of an electrical conductor (e.g. doped polysilicon) into the bottom of the cavity 22. The process for forming this second embodiment of the present invention can be understood with reference to FIGS. 4a–4v.

Figure 4A:
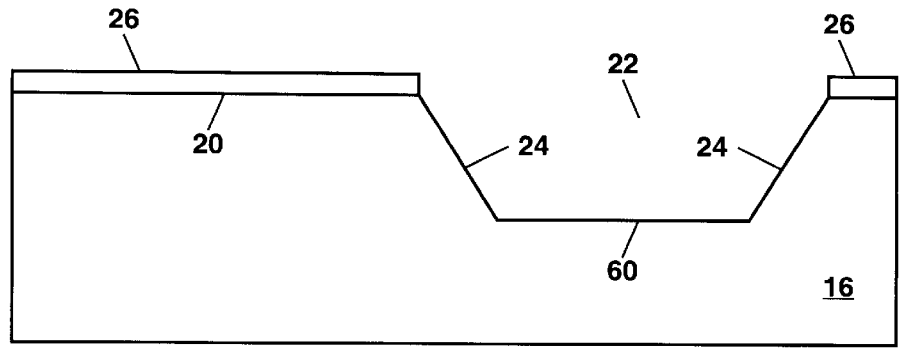
FIGS. 4a–4v show schematic cross-section representations of the MEM capacitance pressure sensor of FIG. 3 during various process steps for forming the device.

In FIG. 4a, a substrate 16 is provided for formation of the second embodiment of the MEM capacitance pressure sensor 10. The substrate 16 is preferably formed of monocrystalline silicon, and can be undoped, or n- or p-type doped depending on a predetermined set of standard processes (and including a set of design rules) to be used for forming the electronic circuitry 14. The substrate 16 can further include one or more epitaxial semiconductor layers grown thereon or buried below the upper surface 20 thereof as described previously with reference to FIG. 2a.

In FIG. 4a, one or more open cavities 22 are wet or dry etched into the substrate 16 using a patterned mask layer 26 at predetermined locations where capacitance pressure sensors 12 are to be formed. The cavities 22 can be of arbitrary shape, for example, circular in shape with a diameter in the range of 50–500 µm and a depth in the range of 2–25 µm, or square in shape with similarly sized dimensions. In the example of FIG. 4a, the cavity 22 is shown with sloping sidewalls 24 which can be formed by a bulk micromachining process using an anisotropic wet etchant such as KOH, TMAH or EDP which terminates etching upon reaching silicon (111) crystalline planes. By timing the anisotropic wet etching, a substantially planar bottom surface 60 can be produced in the cavity 22 as shown in FIG. 4a. After forming the cavity 22, the mask layer 26 can be removed.

Figure 4B:
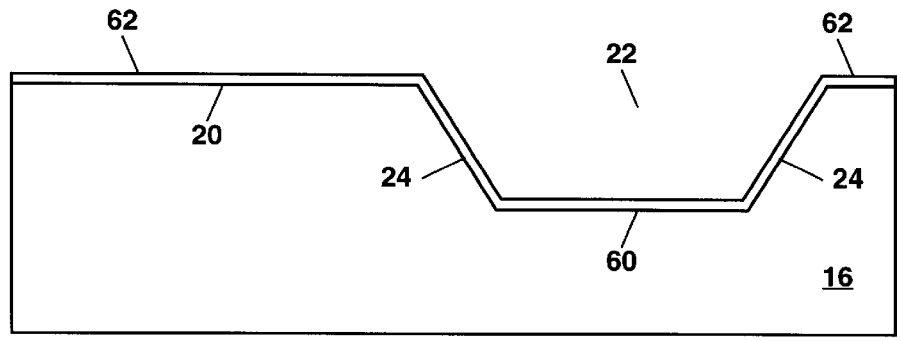

In FIG. 4b, a first nitride layer 62 (i.e. silicon nitride) can be deposited to blanket the upper surface 20 and to line each cavity 22 after first forming a thin blanket layer of a thermal oxide (about 150 nanometers of silicon dioxide formed by a thermal diffusion process) to protect the bare silicon from exposure to the first nitride layer 62. The first nitride layer 62 lining the cavity 22 is preferably formed by LPCVD and can be, for example, from 200–300 nanometers up to about 800 nanometers thick. The portion of the first nitride layer 62 above the upper surface 20 can later be used as a stop for a CMP step for planarizing a topside of the substrate 16; and the remainder of the first nitride layer covering the sidewalls 24 and bottom 60 of the cavity 22 can serve as a dielectric isolation layer to electrically insulate a lower capacitor plate 18 from the underlying substrate 16. The remainder of the first nitride layer within the cavity 22 can also serve as an etch stop during patterning of one or more layers of subsequently deposited material within the cavity 22 and during a subsequent removal of a sacrificial material 30 from the cavity by selective etching.

Figure 4C:
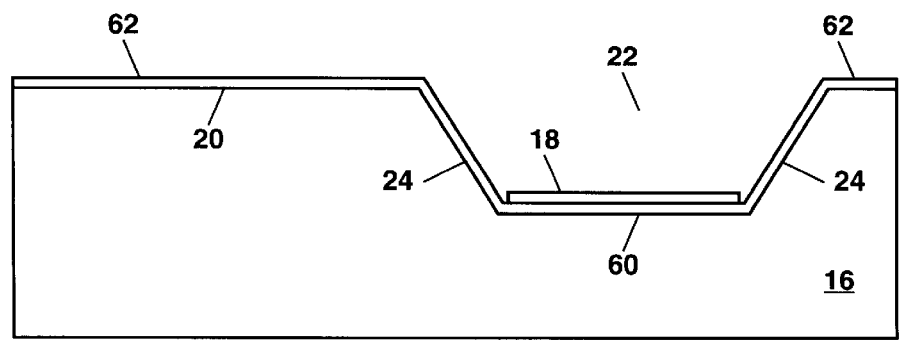
Figure 4D:
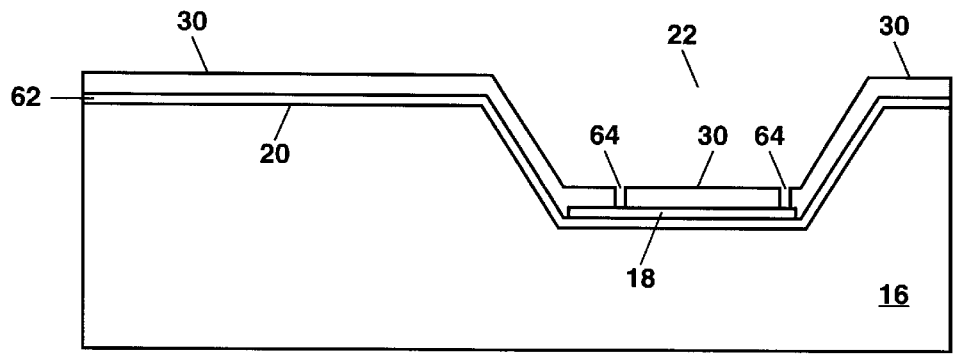

In FIG. 4c, the lower capacitor plate 18 is formed within the cavity 22 by depositing and patterning a layer of an electrically conductive material (e.g. 300 nanometers of polysilicon doped during CVD deposition or by a subsequent ion implantation or thermal diffusion step; or alternately a metal or metal alloy layer). In FIG. 4d a layer of a sacrificial material 30 (e.g. silicon dioxide or a silicate glass such as TEOS) can be blanket deposited over the substrate 16 and within the cavity 22. The sacrificial material 30 can then be patterned (e.g. by reactive ion etching) to form a plurality of first-formed openings or wells 64 down to the underlying lower capacitor plate 18 for use in forming a plurality of posts 66 (see FIG. 4j) for spacing and supporting the upper capacitor plate 34 superposed above the lower capacitor plate 18, and for forming an electrical connection 68 (see FIG. 4j) to the lower capacitor plate 18.

The wells 64 can be sized to have lateral dimensions of about 2–10 µm or more, depending upon the size of the capacitor plates 18 and 34. If problems are encountered in photolithographically defining a mask used to pattern the wells 64 by dry etching (e.g. when an autofocusing projection stepper is used and the depth of the cavity 22 exceeds a depth of field of the stepper), then the method for accurately used, the disclosure of which is incorporated herein by reference.

Figure 4E:
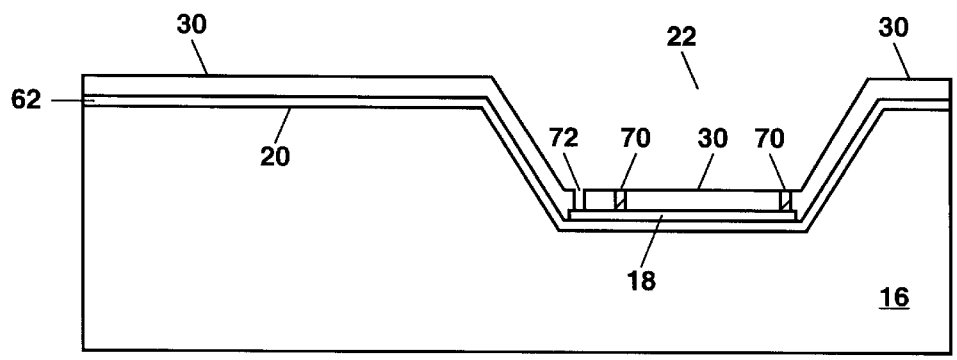

In FIG. 4e, a layer of an electrically-insulating material 70 (e.g. silicon nitride or any electrically-insulating material which is not substantially attacked by the release etchant comprising HF) is deposited to fill the plurality of wells 64 formed in FIG. 4d so that the posts 66 being formed will be electrically insulated from the underlying lower capacitor plate 18. A mask layer (not shown) can then be formed over the substrate and in the cavity 22 and photolithographically patterned to cover the electrically-insulating material 70 and a majority of the sacrificial material 30 so that a second-formed well 72 can be dry etched down through the sacrificial material 30 to the lower capacitor plate 18 as shown in FIG. 4d for use in forming the electrical connection 68 (also termed an electrical interconnection stud) to the lower capacitor plate 18.

Figure 4F:
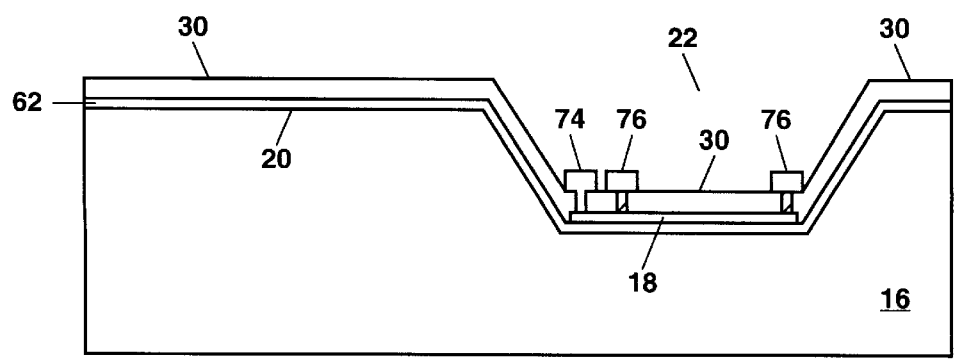

In FIG. 4f, a layer of doped polysilicon of predetermined thickness can be deposited (e.g. by PECVD) over the sacrificial material 30 and in the well 72 and patterned to form a portion 74 to build up the electrical connection 68 being formed at the location of the second-formed well 72, and also to form portions 76 to build up the posts 66 being formed at the location of the first-formed wells 64.

Figure 4G:
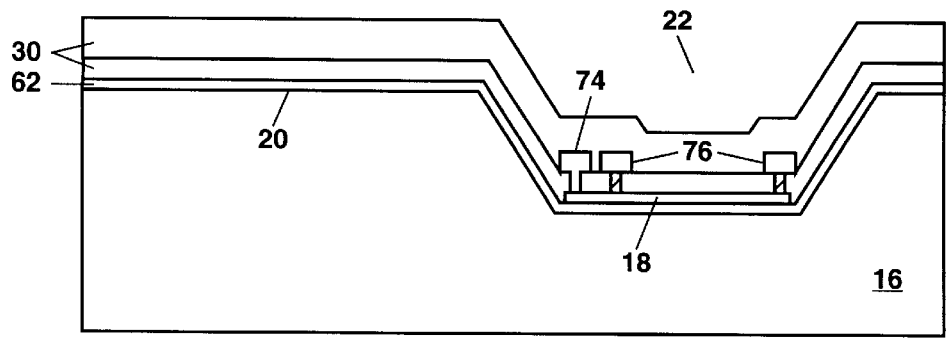
Figure 4H:
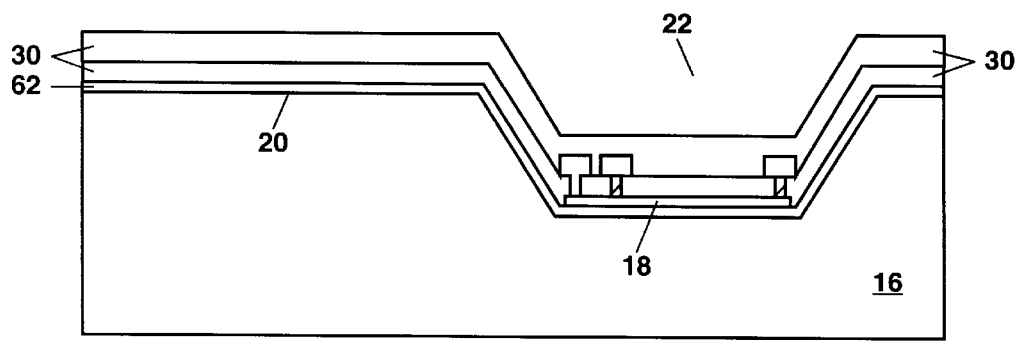

In FIG. 4g, a second layer of sacrificial material 30 (e.g. TEOS) can be blanket deposited over the substrate 16 and in the cavity 22. If needed, the second layer of sacrificial material 30 can be locally planarized within the cavity 22 as shown in FIG. 4h using a CMP step and a resilient polishing pad. Such local planarization within a cavity is disclosed in U.S. patent application Ser. No. 08/915,071 the disclosure of which is incorporated herein by reference. This local planarization step can be useful for maintaining the planarity of each deposited doped polysilicon layer, and especially a final doped polysilicon layer that is used to form the upper capacitor plate 34.

Figure 4I:
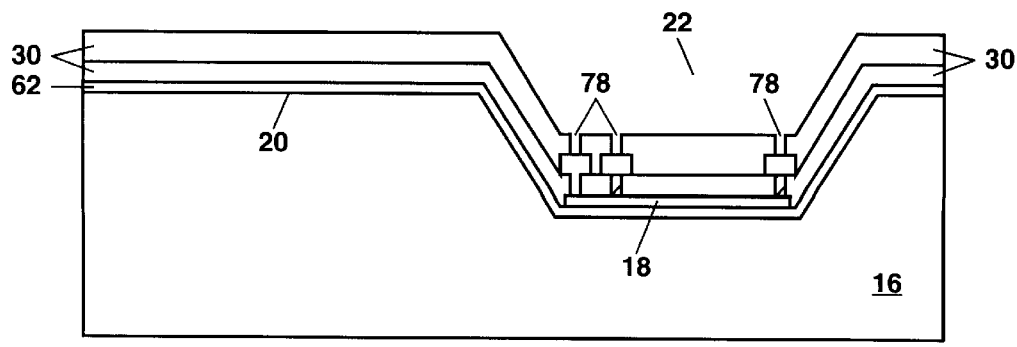
Figure 4J:
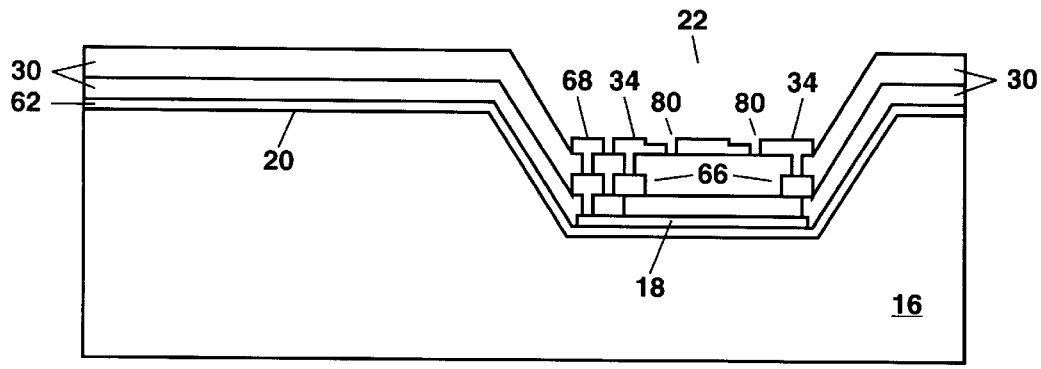

After the local planarization of the second layer of sacrificial material 30, the second layer of sacrificial material 30 can be patterned to form another plurality of wells 78 down to the underlying portions 74 and 76 as shown in FIG. 4i. If the capacitor plates 18 and 34 are closely spaced (e.g. about 2 $\mu$m), then the final doped polysilicon layer can be deposited (e.g. by LPCVD or PECVD to a layer thickness of, for example, 400 nanometers) directly on the second layer of sacrificial material 30 and in the wells 78 to form the upper capacitor plate 34 and extensions of the support posts 66 and the electrical connection 68 as shown in FIG. 4j. Alternately, the upper capacitor plate 34 can be formed of undoped polysilicon which is subsequently doped by ion implantation or thermal dopant diffusion. In yet other embodiments of the present invention, the upper capacitor plate 34 can be formed of a metal (e.g. tungsten) or a metal alloy (e.g. a metal silicide).

Alternately, the support posts 66 and electrical connection 68 can be further built up by the deposition and patterning or additional layers of the sacrificial material 30 and doped polysilicon prior to the formation of the upper capacitor plate 34. This will generally be the case when the capacitor plates 18 and 34 are to be separated by a distance of more than about 2 $\mu$m. This build-up process can be performed by alternately depositing and patterning additional layers of sacrificial material 30 and doped polysilicon as needed to provide a predetermined separation between the lower capacitor plate 18 and the upper capacitor plate 34 which will be formed in the final doped polysilicon layer, with the layers of sacrificial material preferably being locally planarized by CMP after deposition and prior to patterning.

In FIG. 4j, the upper capacitor plate 34 is preferably patterned to provide a plurality of micron-sized openings or channels 80 for later use in removing the underlying sacrificial material 30 during an etch release step. To later aid in sealing the channels 80, these channels can comprise interconnected lateral and vertical portions (see FIG. 4m).

Figure 4K:
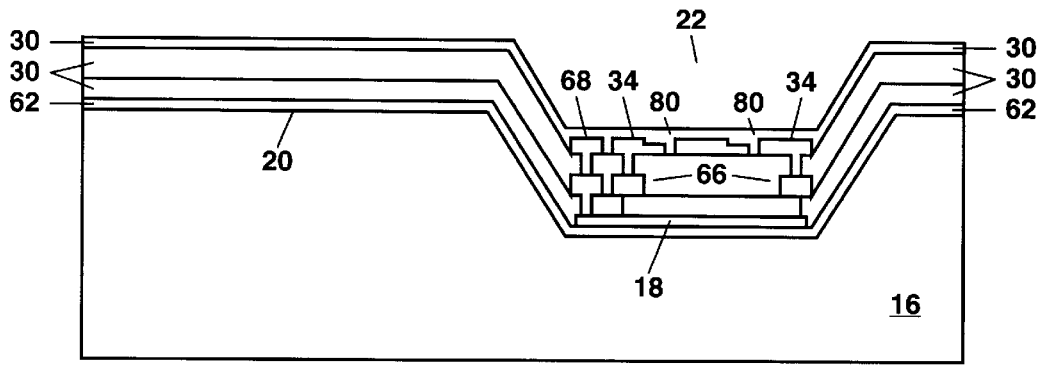
Figure 4L:
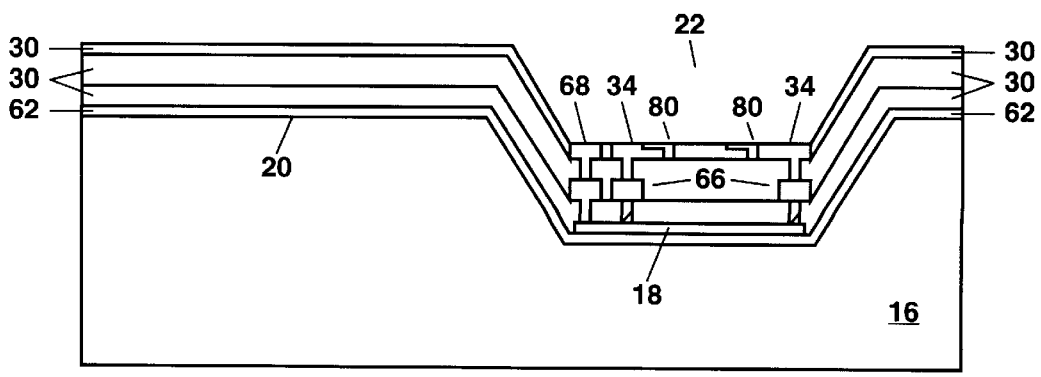

In FIG. 4k, another layer of sacrificial material 30 is blanket deposited over the substrate 16 to further fill the cavity 22 and the channels 80. A CMP step can then be used to remove this layer of sacrificial material 30 back to the upper capacitor plate 34 as shown in FIG. 4l. Alternately, the layer 30 can be dry etched back to the upper capacitor plate 34.

Figure 4M:
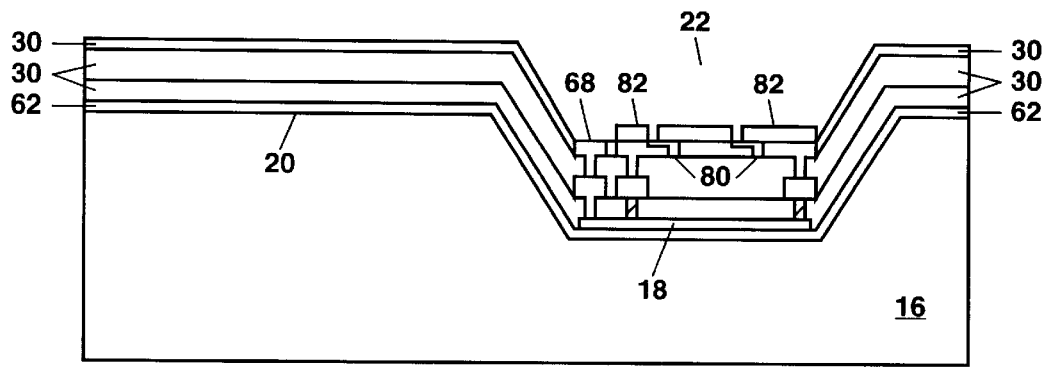

In FIG. 4m, a layer (e.g. about 300 nanometers) of polysilicon or silicon nitride can be deposited (e.g. by LPCVD or PECVD) over the upper capacitor plate 34 and patterned to form a lid 82 having a plurality of openings or through-holes that form a continuation of the channels 80 so that the completed channels 80 follow a circuitous course. When completed to this point, the upper capacitor plate 34 and overlying lid 82 are preferably located entirely below the upper surface of the substrate 16 so that the substrate can later be globally planarized.

Figure 4N:
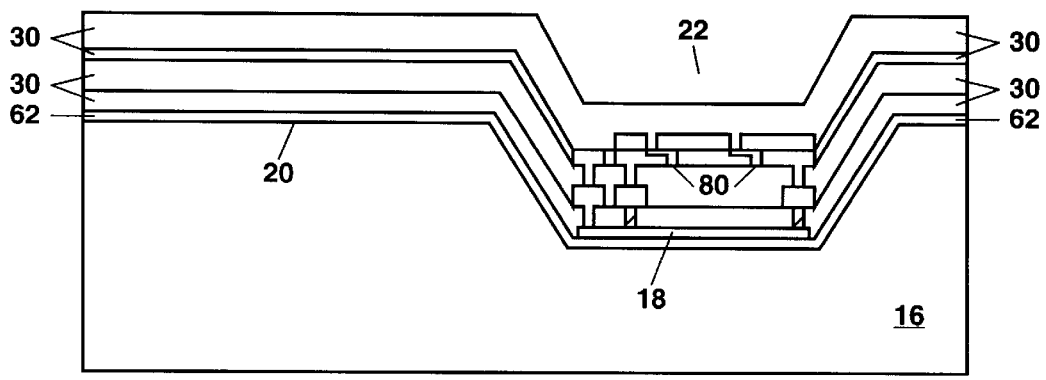

In FIG. 4n, one or more additional layers of sacrificial material 30 are deposited so as to extend upward beyond the upper surface 20 of the substrate 16 and most preferably beyond the first nitride layer 62, thereby overfilling the cavity 22 and allowing a step for globally planarizing the substrate 16. These additional layers of sacrificial material 30 are also used to protect the capacitance pressure sensor 12 comprising the spaced capacitor plates 18 and 34 during subsequent process steps for forming the electronic circuitry 14.

Figure 4O:
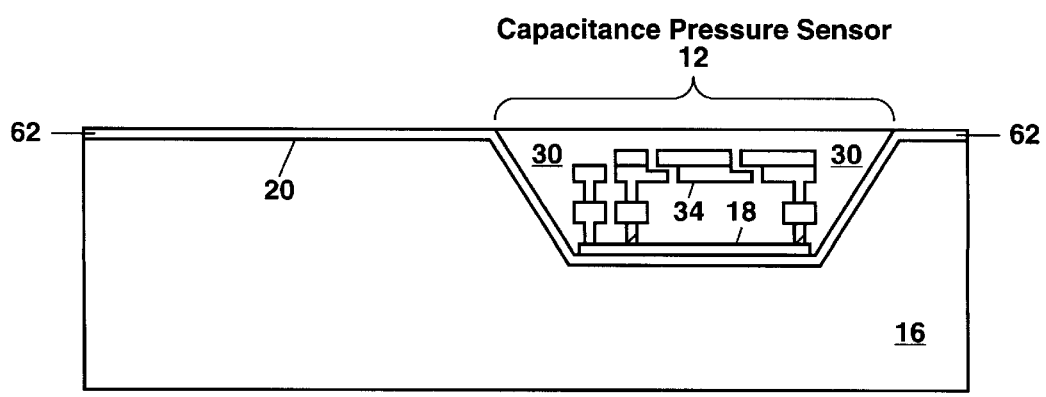

In FIG. 4o, the substrate global planarization step is preferably performed by chemical-mechanical polishing the topside of the substrate 16. To reduce the time required for chemical-mechanical polishing of the substrate, it can be preferable to mask a region above the cavity 22 with a resist or the like and to remove the unmasked portions of the sacrificial layers 30 by a dry etching step. During the substrate planarization step, the first nitride layer 62 is preferably used as a stop to limit a downward extent of the chemical-mechanical polishing, thereby providing a substantially planar topside of the substrate as shown in FIG. 4O. After the chemical-mechanical polishing step, the first nitride layer 62 in acting as a polishing stop can be reduced in thickness.

Figure 4P:
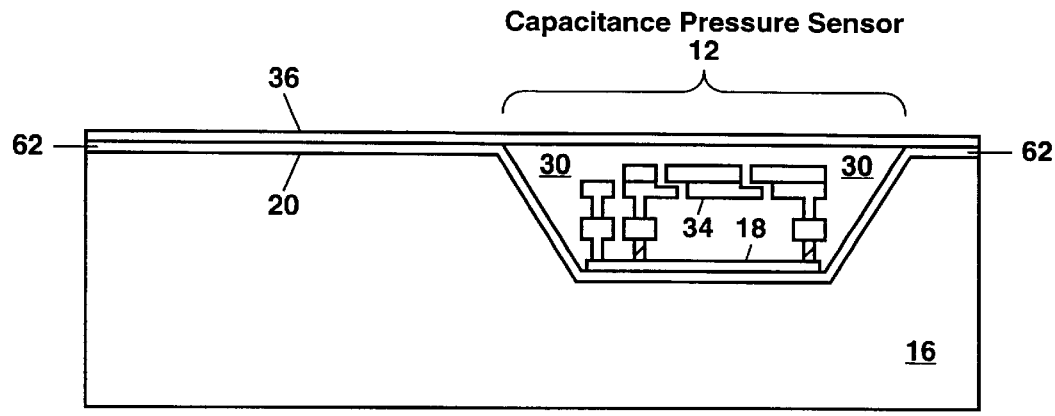

In FIG. 4p, after planarization of the substrate 16, a cap layer 36 comprising 100–300 nanometers of LPCVD silicon nitride can be blanket deposited over the substrate 16 and any exposed portions of the sacrificial layers 30 thereby forming a nitride-to-nitride seal for sealing the encapsulated capacitance pressure sensor 12. After this sealing step has been performed, the electronic circuitry 14 can be fabricated according to conventional methods (i.e. standard process steps with little if any modification thereof as known to the art for forming CMOS, BiCMOS, or bipolar circuitry). The sealed substrate 16 can even be shipped to a foundry or other entity for fabrication of the electronic circuitry 14 by a set of standard process steps.

Since stress within elements of the capacitance pressure sensor 12 can be detrimental and lead to warpage of the upper capacitor plate 34 or premature failure in response to a range of pressure being sensed, an annealing step for relieving stress of elements (especially those elements comprising polysilicon) within the cavity 22 is preferably performed. This annealing step can be performed before fabrication of the electronic circuitry and before the etch release step by heating the substrate and encapsulated capacitance pressure sensor 12 to a preselected temperature in the range of about 700–1300° C. for a time period of up to about three hours or more depending upon the level of stress to be relieved. Alternately, the annealing step can be performed during a thermal cycle used for fabricating the electronic circuitry 14 (e.g one or more thermal diffusion steps for forming transistors).

Figure 4Q:
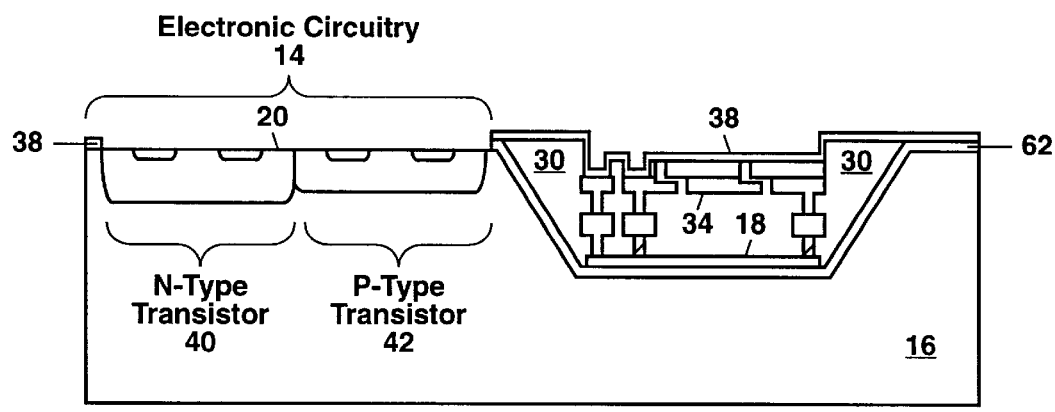

In FIG. 4q, electronic circuitry 14 can be formed on a portion of the substrate 16 proximate to the capacitance pressure sensor 12 using a set of standard process steps as known to the art of semiconductor ICs. The electronic circuitry 14 comprises a plurality of interconnected transistors and circuit elements (e.g. resistors and capacitors) formed on the upper surface 20 of the substrate 16 according to a predetermined circuit diagram for activating and reading out the capacitance pressure sensor 12 and using a predetermined set of design rules (e.g. 0.5 or 2 μm in design rules to form transistors having a corresponding feature size). The process for forming the electronic circuitry 14 has been previously described with reference to FIGS. 2g–2i for forming CMOS circuitry. It will be understood by those skilled in the art that other types of electronic circuitry 14 including BiCMOS circuitry and bipolar circuitry can also be formed using a set of conventional process steps known to the art.

To begin formation of CMOS electronic circuitry 14, the cap layer 36 can be completely removed and the first nitride layer 62 can be locally removed, thereby exposing the upper surface 20 in a portion of the substrate 16 reserved for the electronic circuitry 14. A new thermal oxide layer (not shown) and a new silicon nitride layer 38 can then be formed as described heretofore with reference to FIG. 2g. Before formation of the new silicon nitride layer 38, a dry etching step can be performed to etch downward through the sacrificial material 30 to expose the electrical connection 68 and the lid 82 so that the layer 38 can be deposited in contact with these elements.

In FIG. 4q, openings are formed down through the new thermal oxide layer and the new silicon nitride layer 38 to expose the upper surface 20 at the locations of a plurality of n-type transistors 40 and p-type transistors 42 to be formed in the substrate 16. The transistors 40 and 42 can then be formed by a set of standard CMOS process steps whereby n-type and p-type isolation wells are formed below the upper surface 20 by ion implantation and/or thermal diffusion steps. N-type source and drain regions can then be formed within the p-type wells to fabricate n-type transistors 40; and p-type source and drain regions can be formed within the n-type wells to fabricate p-type transistors 42.

Figure 4R:
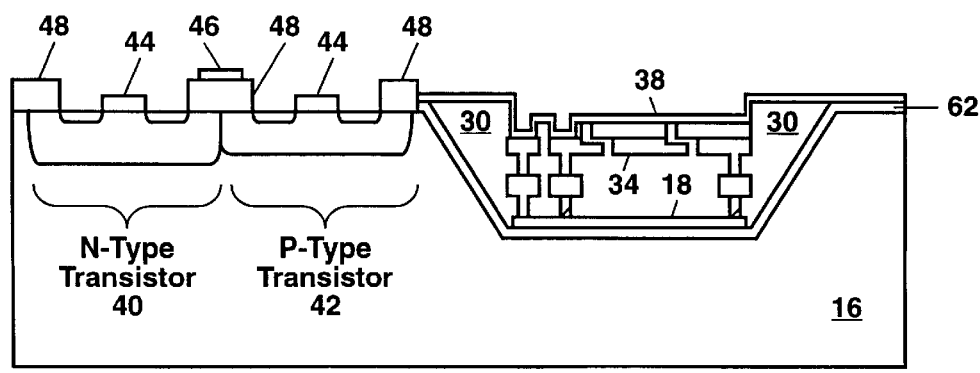

In FIG. 4r, one or more polysilicon layers can be deposited and patterned to form transistor gates 44 and resistors 46. A field oxide layer 48 (e.g. CVD silicon dioxide) can also be deposited and patterned as shown in FIG. 4r to provide electrical isolation between adjacent transistors, and between the transistors and an overlying patterned metallization to be formed subsequently.

Figure 4S:
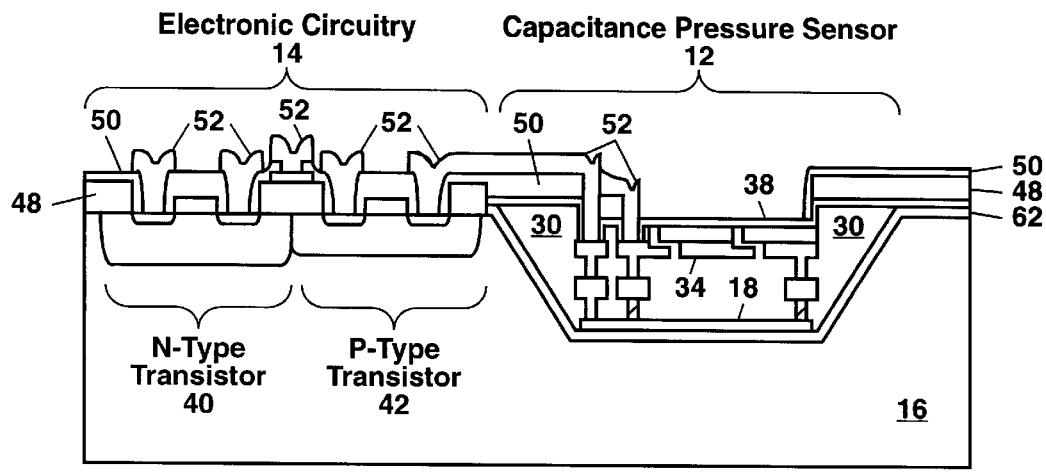

In FIG. 4s, one or more passivation layers 50 (e.g. comprising a silicate glass such as TEOS, PETEOS, PSG, BPSG or combinations thereof) can be deposited over the substrate 16 and patterned to provide a plurality of openings for the deposition of the overlying patterned metallization 52 (e.g. preferably aluminum or an aluminum alloy, although doped polysilicon or metals such as tungsten, gold, copper, platinum, nickel and palladium or metal alloys including metal silicides can be used) for interconnecting the transistors to each other, to other circuit elements and to bonding or contact pads (not shown). Multiple layers of patterned metallization 52 can be separated by and overcoated with additional passivation layers 50 as previously described with reference to FIGS. 2i–2j.

The patterned metallization 52 in FIG. 4s can also be connected to the electrical interconnection 68, which is in turn connected to the lower capacitor plate 18 after etching down to expose the electrical interconnection 68. Similarly, the patterned metallization 52 can be connected to the upper capacitor plate 34 after etching down thereto. The electrical interconnections between the capacitance pressure sensor 12 and the electronic circuitry 14 allow the circuitry to detect a change in applied pressure resulting in a movement of the upper capacitor plate 34 which alters the capacitance between the plates 18 and 34.

Figure 4T:
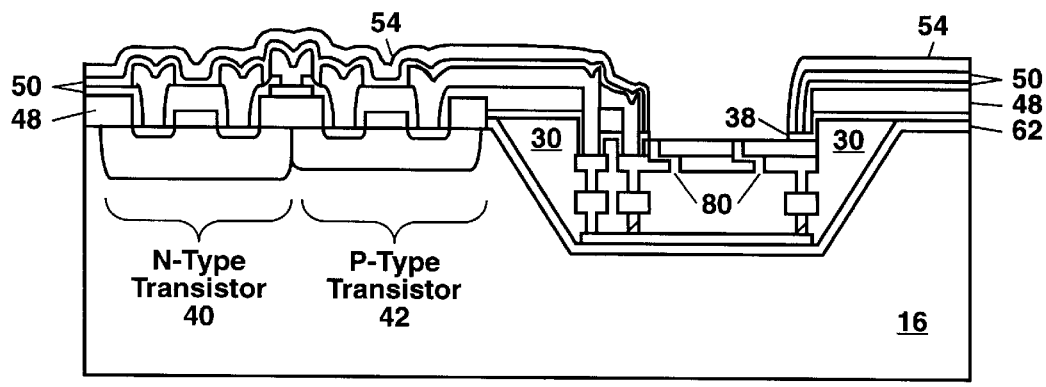

In FIG. 4t, a protection layer 54 can be deposited to cover the electronic circuitry 14 and the interconnect metallization 52 for use during an etch release step whereby the layers of sacrificial material 30 are removed, at least in part, by a selective etchant comprising hydrofluoric acid (HF). The protection layer 54, which is chemically resistant to attack by HF, has been described previously with reference to FIG. 2j.

After formation of the protection layer 54, the substrate 16 can be patterned and etched to remove a portion of the silicon nitride layer 38 overlying the lid 82 as shown in FIG. 4t, thereby exposing the channels 80.

Figure 4U:
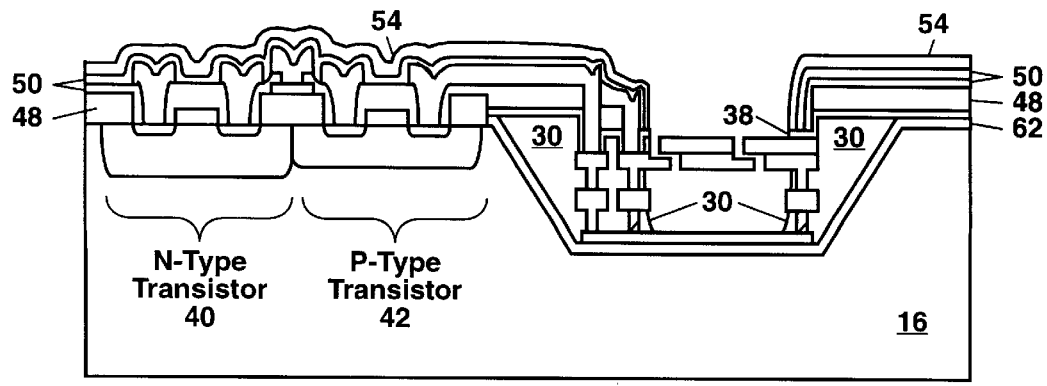

In FIG. 4u, an etch release step can be performed to partially or completely remove the sacrificial material 30 in the channels 80 and between the capacitor plates 18 and 34 by selective etching with a selective etchant comprising HF as described previously for the first embodiment of the present invention. The etch release step removes the sacrificial material 30 by etching downward through the channels 80 and laterally outward from each channel 80. Thus, by timing the etch release step, the sacrificial material between the plates 18 and 34 can be removed while leaving some of the sacrificial material 30 near the sloped sidewalls 24 of the cavity 22. This incompletely removed sacrificial material 30 can be used to advantage to anchor the support posts 66 and the electrical interconnection 68 as shown in FIG. 4u. Alternately, the sacrificial material 30 can be completely removed during the etch release step by using a prolonged etch time (e.g. overnight).

Figure 4V:
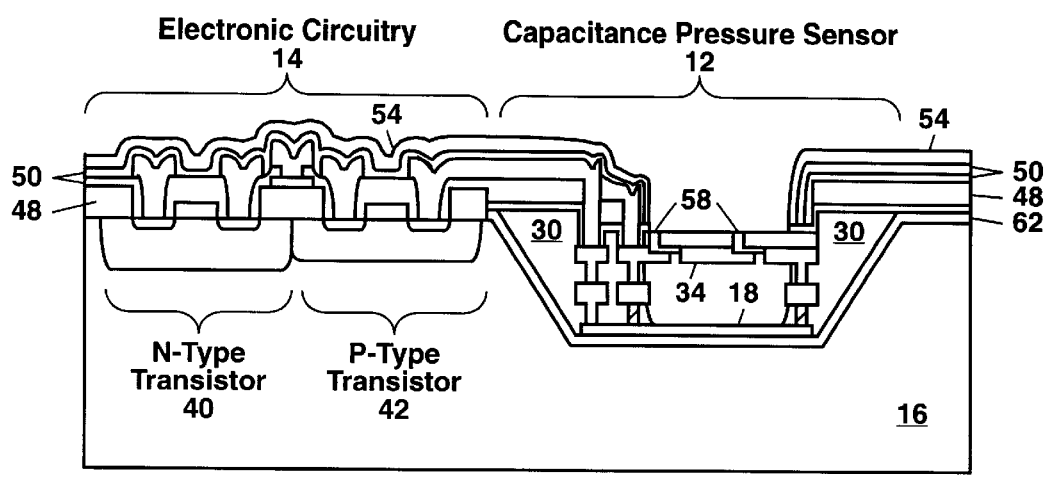

After the etch removal step, the substrate 16 can be washed and dried. The lid 82 is preferably left in place to aid in sealing the cavity to form a sealed-cavity device 10. This can be done by plugging the channels 80 with deposited PECVD silicon nitride plugs 58 as shown in FIG. 4v, or alternately with sputtered or evaporated metal. This step can be performed in a deposition chamber to provide a predetermined level of vacuum or pressure within the cavity between the capacitor plates 18 and 34. The circuitous shape of the channels 80 in FIG. 4v is particularly advantageous for maintaining the integrity of the seal for the cavity especially at elevated pressures since the plugs 58 are supported underneath by the upper capacitor plate 34. The protection layer 54 can be optionally removed entirely or in part (e.g. at the locations of bonding pads). The completed device 10 can then be packaged for use.

Variations of the second embodiment of the present invention are possible. For example, the capacitance pressure sensor 12 and the electronic circuitry 14 can be formed in a silicon layer epitaxially grown on the substrate 16 rather being formed in the substrate itself. Additionally, the cavity 22 can be formed with vertical sidewalls rather than with sloping sidewalls. The support posts 66 can be omitted, especially when some sacrificial material 30 is left in the cavity 22 to support and anchor the upper capacitor plate 34. The electrical interconnection 68 can run along a sloping sidewall 24 of the cavity 22, for example, by patterning the doped polysilicon blanket deposited in the cavity 22 to form both the lower capacitor plate 18 to also form the electrical interconnection 68 to run along one of the sidewalls 24. The lower capacitor plate 18 can be made smaller in size than the upper capacitor plate 34 so that the support posts 66 can be built up directly on the first nitride layer 62 outside the lower capacitor plate 18, thereby eliminating the need for the layer of electrically-insulating material 70 and allowing the support posts 66 to be formed completely of polysilicon.

Other applications and variations of the apparatus and method of the present invention will become evident to those skilled in the art. The actual scope of the invention is intended to be defined in the following claims when viewed in their proper perspective based on the prior art.

What is claimed is:

1. A microelectromechanical (MEM) capacitance pressure sensor, comprising:
   (a) a silicon substrate having an upper surface;
   (b) a cavity formed below the upper surface of the silicon substrate;
   (c) a first capacitor plate formed in the substrate below the cavity with a dopant type opposite that of the substrate, and forming in combination with the substrate a reverse-biased semiconductor p-n junction;
   (d) a substantially planar diaphragm covering the cavity;
   (e) a second capacitor plate formed on a surface of the diaphragm; and
   (f) electronic circuitry, comprising a plurality of transistors, formed on the substrate proximate to the cavity and connected to the first and second capacitor plates for sensing a change in pressure from a deflection in the diaphragm.

2. The pressure sensor in claim 1 wherein the cavity has sloped sidewalls.

3. The pressure sensor in claim 1 wherein the cavity has sidewalls that are substantially orthogonal to the upper surface of the substrate.

4. The pressure sensor in claim 1 wherein the diaphragm comprises polysilicon.

5. The pressure sensor in claim 1 wherein the diaphragm comprises silicon nitride.

6. The pressure sensor in claim 1 wherein the diaphragm is adhered to the upper surface of the substrate.

7. The pressure sensor in claim 1 wherein the second capacitor plate is formed on an underside of the diaphragm.

8. The pressure sensor in claim 1 wherein the second capacitor plate is formed on a topside of the diaphragm.

9. The pressure sensor in claim 1 wherein the second capacitor plate comprises, at least in part, doped polysilicon.

10. The pressure sensor in claim 1 wherein the second capacitor plate comprises a deposited metal or metal alloy.

11. The pressure sensor in claim 1 wherein the electronic circuitry is selected from the group consisting of complementary metal-oxide semiconductor (CMOS) circuitry, bipolar complementary metal-oxide semiconductor (BiCMOS) circuitry and bipolar circuitry.

12. The pressure sensor in claim 11 wherein the electronic circuitry includes an interconnect metallization comprising aluminum.

13. A microelectromechanical (MEM) capacitance pressure sensor, comprising:
   (a) a silicon substrate having a cavity formed below an upper surface thereof;
   (b) a capacitance pressure sensor formed within the cavity below the upper surface of the substrate and further comprising a lower capacitor plate and an upper capacitor plate spaced apart from each other, with one of the capacitor plates being moveable in response to applied pressure; and
   (c) electronic circuitry, comprising a plurality of transistors, formed on the upper surface of the substrate proximate to the cavity and connected to the capacitor plates for sensing the applied pressure.

14. The pressure sensor in claim 13 wherein the cavity has sloped sidewalls.

15. The pressure sensor in claim 13 wherein the cavity has sidewalls that are substantially orthogonal to the upper surface of the substrate.

16. The pressure sensor in claim 13 wherein the capacitor plates comprise doped polysilicon.

17. The pressure sensor in claim 13 wherein the capacitor plates comprise a deposited metal or metal alloy.

18. The pressure sensor in claim 13 wherein the capacitor plates are spaced apart by a plurality of support posts.

19. The pressure sensor in claim 13 wherein the capacitor plates are supported by an incompletely removed sacrificial material.

20. The pressure sensor in claim 13 wherein the electronic circuitry is selected from the group consisting of complementary metal-oxide semiconductor (CMOS) circuitry, bipolar complementary metal-oxide semiconductor (BiCMOS) circuitry, and bipolar circuitry.

21. The pressure sensor in claim 20 wherein the electronic circuitry includes an interconnect metallization comprising aluminum.

22. A method for forming a microelectromechanical (MEM) capacitance pressure sensor, comprising steps for:
   (a) providing a doped silicon substrate;
   (b) forming a cavity below an upper surface of the substrate;
   (c) forming a first capacitor plate in a portion of the substrate below the cavity by doping the portion of the substrate with a dopant type opposite from the dopant type of the substrate;
   (d) depositing a sacrificial material within the cavity and overfilling the cavity;
   (e) planarizing the substrate;
   (f) forming a diaphragm covering the cavity;
   (g) forming a second capacitor plate on a surface of the diaphragm;
   (h) fabricating electronic circuitry comprising a plurality of transistors on the upper surface of the substrate, with the electronic circuitry being electrically connected to the first and second capacitor plates; and
   (i) removing the sacrificial material, at least in part, from within the cavity.

23. The method of claim 22 wherein the step for providing the silicon substrate comprises providing an n-type-doped silicon substrate.

24. The method of claim 22 wherein the step for providing the silicon substrate comprises providing a p-type-doped silicon substrate.

25. The method of claim 22 wherein the step for forming the cavity comprises a step for etching the cavity.

26. The method of claim 25 wherein the etching step comprises dry etching with a plasma.

27. The method of claim 25 wherein the etching step comprises wet etching with an anisotropic etchant.

28. The method of claim 27 wherein the anisotropic etchant is selected from the group consisting of potassium hydroxide (KOH), tetramethyl ammonium hydroxide (TMAH) and ethylenediamine pyrocatechol (EDP).

29. The method of claim 22 wherein the step for forming the first capacitor plate by doping the portion of the substrate comprises a step for thermally diffusing dopant ions into the substrate.

30. The method of claim 29 wherein the dopant ions are derived from a borosilicate glass or a phosphosilicate glass after a step for depositing a layer of the glass within the cavity.

31. The method of claim 29 wherein the step for forming the first capacitor plate further dopes at least one sidewall of the cavity.

32. The method of claim 22 wherein the step for forming the first capacitor plate by doping the portion of the substrate comprises a step for implanting dopant ions into the substrate.

33. The method of claim 22 wherein the step for depositing the sacrificial material within the cavity and overfilling the cavity comprises depositing at least one layer of a silicate glass.

34. The method of claim 33 wherein depositing the layer of silicate glass comprises chemical vapor depositing the layer of silicate glass from the decomposition of tetraethylortho silicate.

35. The method of claim 22 wherein the step for planarizing the substrate comprises chemical mechanical polishing a topside of the substrate.

36. The method of claim 22 wherein the step for forming the diaphragm covering the cavity comprises depositing and a layer of silicon nitride over the substrate.

37. The method of claim 36 wherein the second capacitor plate comprises a layer of an electrically conductive material deposited above the diaphragm.

38. The method of claim 36 wherein the second capacitor plate comprises a layer of an electrically conductive material deposited below the diaphragm.

39. The method of claim 22 wherein the step for forming the diaphragm covering the cavity comprises depositing and patterning a layer of polysilicon.

40. The method of claim 39 wherein the step for forming the second capacitor plate comprises doping the polysilicon, at least in part, by implanting or thermally diffusing dopant ions into the polysilicon.

41. The method of claim 22 further including a step for annealing the substrate prior to the step for fabricating electronic circuitry.

42. The method of claim 22 wherein the step for fabricating electronic circuitry comprises fabricating circuitry selected from the group consisting of complementary-metal-oxide-semiconductor (CMOS) circuitry, bipolar complementary-metal-oxide-semiconductor (BiCMOS) circuitry and bipolar circuitry.

43. The method of claim 22 further including a step for forming a protection layer over the electronic circuitry prior to the step for removing the sacrificial material, at least in part, from within the cavity.

44. The method of claim 22 wherein the step for removing the sacrificial material, at least in part, from within the cavity comprises steps for forming a plurality of channels to expose the sacrificial material and removing the sacrificial material by etching with a selective etchant comprising hydrofluoric acid (HF).

45. The method of claim 44 further including a step for plugging the channels after the step for removing the sacrificial material, at least in part, from within the cavity.

46. The method of claim 45 wherein the step for plugging the channels comprises depositing silicon nitride within the channels.

47. A method for forming a microelectromechanical (MEM) capacitance pressure sensor on a silicon substrate, comprising steps for:

(a) forming a cavity below an upper surface of the substrate;

(b) forming a first capacitor plate by depositing a layer of an electrically conductive material within the cavity;

(c) forming a second capacitor plate above the first capacitor plate;

(d) depositing a sacrificial material within the cavity and overfilling the cavity;

(e) planarizing the substrate;

(f) fabricating electronic circuitry comprising a plurality of transistors on the upper surface of the substrate, with the electronic circuitry being electrically connected to the first and second capacitor plates; and (g) removing the sacrificial material, at least in part, from within the cavity.

48. The method of claim 47 wherein the step for forming the cavity comprises a step for etching the cavity.

49. The method of claim 48 further including a step for lining the cavity with a layer of silicon nitride.

50. The method of claim 48 wherein the etching step comprises dry etching with a plasma.

51. The method of claim 48 wherein the etching step comprises wet etching with an anisotropic etchant.

52. The method of claim 51 wherein the anisotropic etchant is selected from the group consisting of potassium hydroxide (KOH), tetramethyl ammonium hydroxide (TMAH) and ethylenediamine pyrocatechol (EDP).

53. The method of claim 47 wherein the step for forming the first capacitor plate further comprises a step for patterning the deposited layer of the electrically conductive material.

54. The method of claim 47 wherein the step for depositing the electrically conductive material comprises depositing an electrically conductive material selected from the group consisting of doped polysilicon, metals and metal alloys.

55. The method of claim 47 wherein the step for forming the first capacitor plate further comprises forming an electrical interconnection to connect the first capacitor plate with the electronic circuitry.

56. The method of claim 47 wherein the step for forming the second capacitor plate comprises steps for depositing and patterning a layer of an electrically conductive material selected from the group consisting of doped polysilicon, metals and metal alloys.

57. The method of claim 47 wherein the step for forming the second capacitor plate comprises forming the second capacitor plate below the upper surface of the substrate.

58. The method of claim 57 wherein the step for depositing the sacrificial material within the cavity and overfilling the cavity encapsulates the first and second capacitor plates within the sacrificial material.

59. The method of claim 57 further including a step for forming a lid covering the second capacitor plate.

60. The method of claim 59 further including steps for forming a plurality of circuitous channels through the second capacitor plate and the lid.

61. The method of claim 47 further including steps for forming a plurality of support posts to support the second capacitor plate above the first capacitor plate.

62. The method of claim 47 wherein the step for depositing the sacrificial material within the cavity and overfilling the cavity comprises depositing at least one layer of a silicate glass.

63. The method of claim 62 wherein depositing the layer of silicate glass comprises chemical vapor depositing the layer of silicate glass from the decomposition of tetraethylortho silicate.

64. The method of claim 47 wherein the step for planarizing the substrate comprises chemical mechanical polishing a topside of the substrate.

65. The method of claim 47 further including a step for annealing the substrate prior to the step for fabricating electronic circuitry.

66. The method of claim 47 wherein the step for fabricating electronic circuitry comprises fabricating circuitry selected from the group consisting of complementary-metal-oxide-semiconductor (CMOS) circuitry, bipolar complementary-metal-oxide-semiconductor (BiCMOS) circuitry and bipolar circuitry.

67. The method of claim 47 further including a step for forming a protection layer over the electronic circuitry prior to the step for removing the sacrificial material, at least in part, from within the cavity.

68. The method of claim 47 wherein the step for removing the sacrificial material, at least in part, from within the cavity comprises steps for forming a plurality of channels to expose the sacrificial material and removing the sacrificial material by etching with a selective etchant comprising hydrofluoric acid (HF).

69. The method of claim 68 further including a step for plugging the channels after the step for removing the sacrificial material, at least in part, from within the cavity.

70. The method of claim 69 wherein the step for plugging the channels comprises depositing silicon nitride within the channels.

\* \* \* \* \*